United States Patent
Gomez et al.

(10) Patent No.: US 10,658,979 B2
(45) Date of Patent: May 19, 2020

(54) POWER AMPLIFIER WITH SUPPLY SWITCHING

(71) Applicant: Avago Technologies International Sales Pte. Limited, Singapore (SG)

(72) Inventors: Ramon A. Gomez, San Juan Capistrano, CA (US); Jeffrey Lee, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/196,174

(22) Filed: Nov. 20, 2018

(65) Prior Publication Data
US 2019/0089311 A1    Mar. 21, 2019

Related U.S. Application Data

(63) Continuation of application No. 15/702,633, filed on Sep. 12, 2017, now Pat. No. 10,141,891.
(Continued)

(51) Int. Cl.
*H03F 3/20*    (2006.01)
*H03F 1/02*    (2006.01)
(Continued)

(52) U.S. Cl.
CPC .......... *H03F 1/0233* (2013.01); *H03F 1/025* (2013.01); *H03F 1/0227* (2013.01); *H03F 1/305* (2013.01);
(Continued)

(58) Field of Classification Search
CPC .... H03F 3/20; H03F 3/04; H03F 3/45; H03G 3/30
(Continued)

(56) References Cited

U.S. PATENT DOCUMENTS 3,566,245 A * 2/1971 Blokker et al. ......... G05F 1/445
363/2
3,735,235 A * 5/1973 Hamilton ............ H02M 3/3378
363/26
(Continued)

OTHER PUBLICATIONS

Wang, et al., "A 5.2-to-13GHz Class-AB CMOS Power Amplifier with a 25.2dBm Peak Output Power at 21.6% PAE", ISSCC 2010 / Session 2 / mm-Wave Beamforming & RF Building Blocks / 2.4, IEEE International Solid-State Circuits Conference, Feb. 8, 2010, pp. 44-46.
(Continued)

*Primary Examiner* — Henry Choe
(74) *Attorney, Agent, or Firm* — Morgan, Lewis & Bockius LLP

(57) ABSTRACT

A power amplifier with supply switching is provided. The power amplifier detects a magnitude of an outgoing broadband communication signal and determines whether the magnitude exceeds a predetermined voltage threshold. The power amplifier applies a first gain to the outgoing broadband communication signal using a first voltage supply rail when it is determined that the magnitude exceeds the predetermined voltage threshold and a second gain using a second voltage supply rail that is smaller than the first voltage supply rail when it is determined that the magnitude does not exceed the predetermined voltage threshold. The power amplifier produces an output signal from the outgoing broadband communication signal with the applied first gain or the applied second gain, wherein a current of the outgoing broadband communication signal is switched between the first voltage supply rail and the second voltage supply rail in response to the magnitude being detected.

20 Claims, 16 Drawing Sheets

Related U.S. Application Data

(60) Provisional application No. 62/393,633, filed on Sep. 12, 2016.

(51) Int. Cl.

| | | |
|---|---|---|
| *H03G 1/00* | (2006.01) | |
| *H03F 3/193* | (2006.01) | |
| *H03F 1/30* | (2006.01) | |
| *H03F 3/21* | (2006.01) | |
| *H04B 1/16* | (2006.01) | |
| *H04B 3/54* | (2006.01) | |
| *H03F 3/00* | (2006.01) | |
| *H03G 3/30* | (2006.01) | |
| *H03F 3/195* | (2006.01) | |
| *H03F 3/24* | (2006.01) | |
| *H03F 3/45* | (2006.01) | |

(52) U.S. Cl.
CPC .............. *H03F 3/005* (2013.01); *H03F 3/193* (2013.01); *H03F 3/195* (2013.01); *H03F 3/211* (2013.01); *H03F 3/245* (2013.01); *H03F 3/45183* (2013.01); *H03F 3/45475* (2013.01); *H03G 1/0029* (2013.01); *H03G 3/3042* (2013.01); *H04B 1/16* (2013.01); *H04B 3/544* (2013.01); *H03F 2200/105* (2013.01); *H03F 2200/372* (2013.01); *H03F 2200/435* (2013.01); *H03F 2200/507* (2013.01); *H03F 2200/511* (2013.01); *H03F 2200/541* (2013.01); *H03F 2203/45644* (2013.01)

(58) Field of Classification Search
USPC ......................................... 330/285, 296, 261
See application file for complete search history.

(56) References Cited

U.S. PATENT DOCUMENTS

| | | | | |
|---|---|---|---|---|
| 3,787,709 | A * | 1/1974 | Coe ...................... | H01R 13/648 361/45 |
| 2016/0036393 | A1* | 2/2016 | Lin ......................... | H03F 1/32 330/295 |
| 2017/0126185 | A1* | 5/2017 | Kang ...................... | H03F 1/565 |

OTHER PUBLICATIONS

Yoo, et al., "A Class-G Dual Supply Switched-Capacitor Power Amplifier in 65nm CMOS", Radio Frequency Integrated Circuits Symposium, 2012, pp. 233-236.

Ye, et al., "A 2-to-6GHz Class-AB Power Amplifier with 28.4% PAE in 65nm CMOS Supporting 256QAM" ISSCC 2015 / Session 2 / RF TX/RX Design Techniques / 2.5, IEEE International Solid-State Circuits Conference, Feb. 23, 2015, pp. 38-40.

Hu, et al., "A Broadband Mixed-Signal CMOS Power Amplifier With a Hybrid Class-G Doherty Efficiency Enhancement Technique" IEEE Journal of Solid-State Circuits, Mar. 2016, pp. 598-613, vol. 51, No. 3.

Chowdhury, et al., "A Fully Integrated Reconfigurable Wideband Envelope-Tracking SoC for High-Bandwidth WLAN Applications in a 28nm CMOS Technology", ISSCC 2017 / Session 2 / Power Amplifiers / 2.2, IEEE International Solid-State Conference, Feb. 6, 2017, pp. 34-36.

* cited by examiner

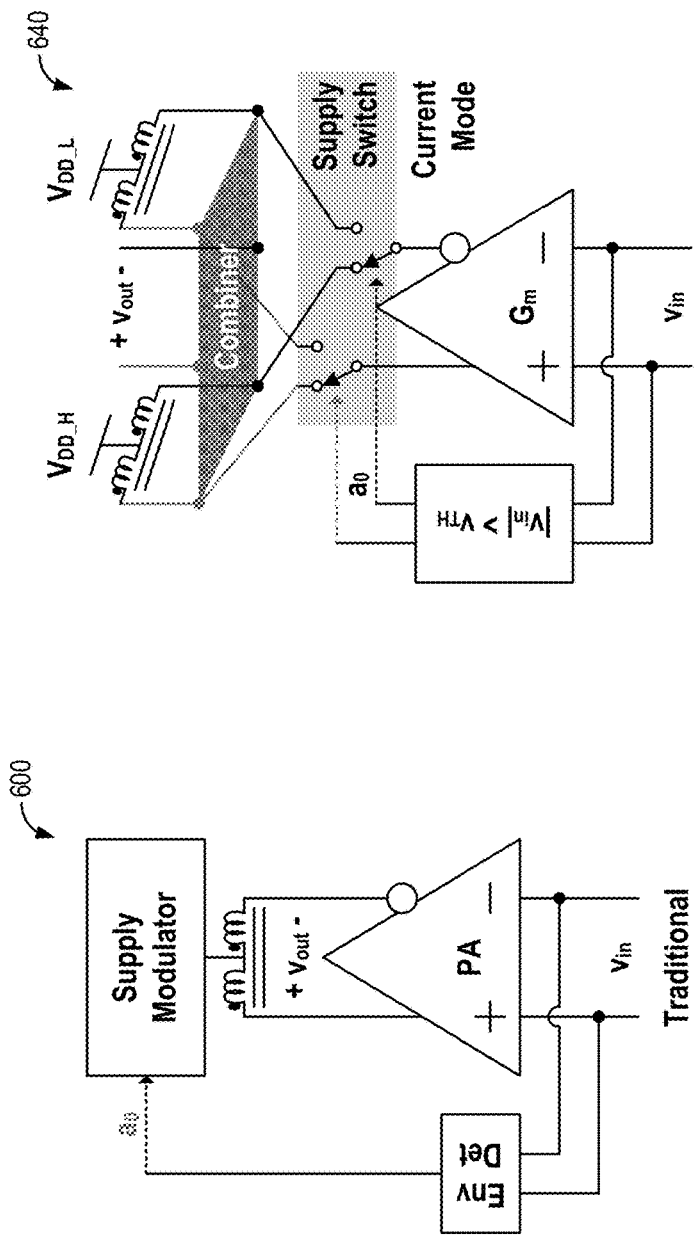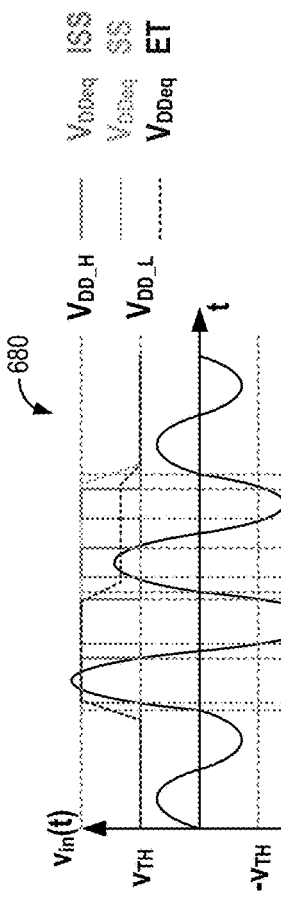
FIG. 6A — Traditional
FIG. 6B — Instantaneous Supply Switching
FIG. 6C

POWER AMPLIFIER WITH SUPPLY SWITCHING

CROSS-REFERENCE TO RELATED APPLICATIONS

The present application is a continuation of U.S. patent application Ser. No. 15/702,633, entitled "POWER AMPLIFIER WITH SUPPLY SWITCHING," filed on Sep. 12, 2017, which claims the benefit of priority under 35 U.S.C. § 119 from U.S. Provisional Patent Application Ser. No. 62/393,633, entitled "POWER AMPLIFIER WITH SUPPLY SWITCHING," filed on Sep. 12, 2016, the disclosures of which are hereby incorporated by reference in their entirety for all purposes.

TECHNICAL FIELD

The present disclosure relates to radio frequency semiconductor devices, and more particularly to power amplifiers with supply switching.

BACKGROUND

Many broadband communication signals include multiple orthogonal carriers (e.g., OFDM, LTE, MoCA, etc.) and thus have a Gaussian voltage distribution and high peak-to-average-power ratio (PAPR) characteristics. Traditional power amplifiers (e.g., class A, class B) have very low power efficiency (e.g., respectively 1-2%, 10-30%) when handling peak events of these signals. Traditional approaches for improving the power efficiency of a power amplifier (PA) include varying the power supply provided to the amplifier as a function of the amplitude of the input signal. However, these approaches are limited by the bandwidth of the input amplitude tracking circuitry and therefore are inefficient for broadband communication signals (e.g., LTE, cable television (CATV) signals, etc.).

BRIEF DESCRIPTION OF THE DRAWINGS

Certain features of the subject technology are set forth in the appended claims. However, for purpose of explanation, one or more implementations of the subject technology are set forth in the following figures.

FIGS. 6A-6C illustrate an example a traditional supply modulator compared to an instantaneous supply switching circuit.

DETAILED DESCRIPTION

Figure 1:
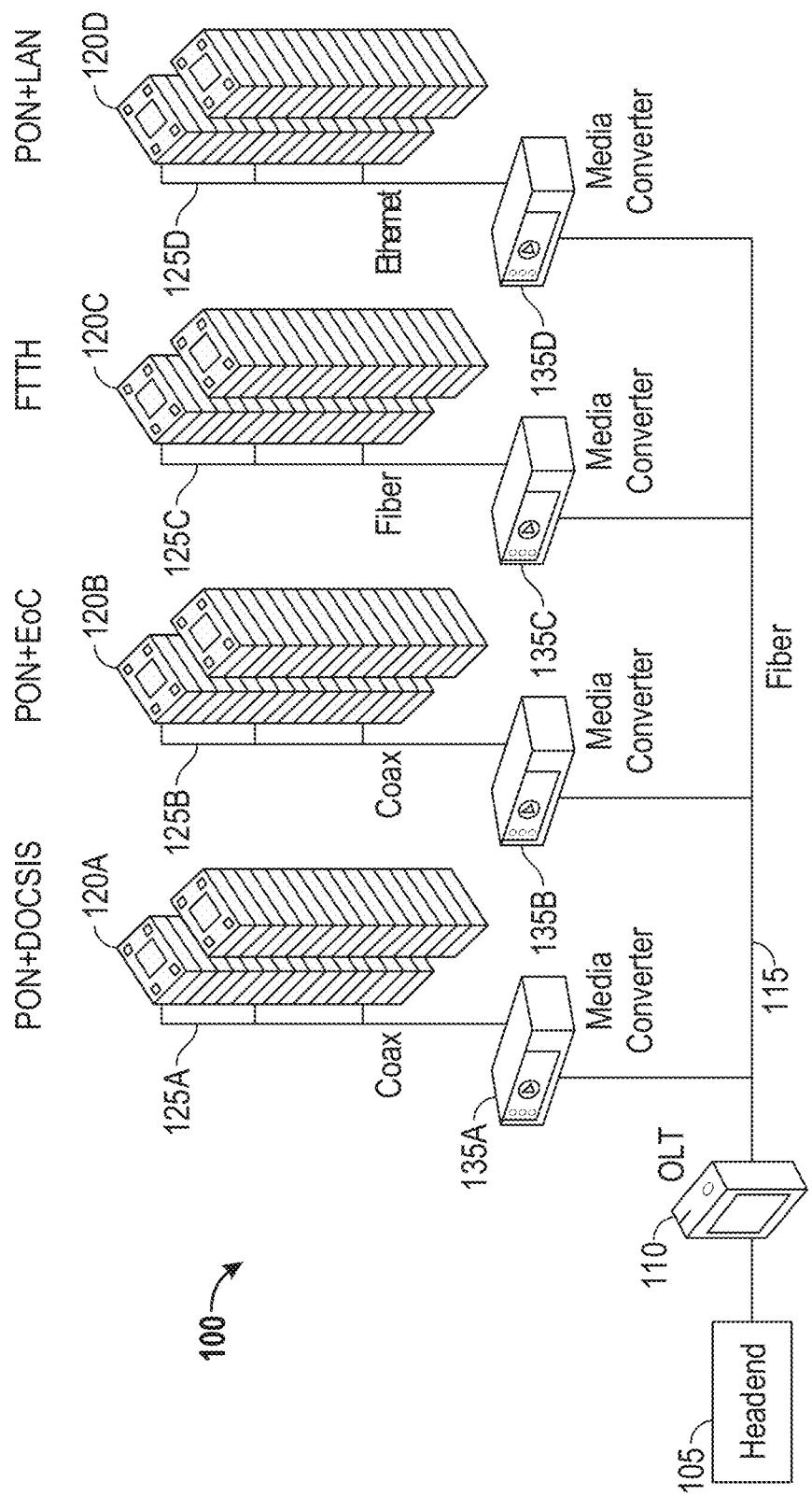
FIG. 1 illustrates an example network environment in which a content distribution system having a power amplifier with supply switching may be implemented in accordance with one or more implementations.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, structures and components are shown in block diagram form in order to avoid obscuring the concepts of the subject technology.

Modern CATV systems provide not only one-way broadcast programming, but also high-speed two-way communications between customers and the Internet. Cable modems are a primary source of Internet connectivity for millions of consumers worldwide, backhauling local WiFi communications for residential and business customers. Modern high-spectral-efficiency CATV systems, such as those based on the Data Over Cable Service Interface Specification (DOCSIS) 3.1 standard, increasingly depend on complex signal modulation, with high-order constellations (≥256-QAM), multi-carrier signaling (OFDM) and multi-channel aggregation.

Contemporary high-spectral-efficiency communication systems (e.g. LTE, 802.11, cable television) increasingly rely on complex modulation, with high-order constellations (e.g. 256QAM) and multi-carrier signaling (e.g., OFDM). These formats often have high PAPR, up to 11 dB, with nearly Gaussian voltage distributions. In traditional amplification systems, the peak power is typically defined by that of a sine wave with the same maximum amplitude as the modulated signal. Traditional single-carrier standards generally have much lower PAPR (e.g. GMSK modulation with <1 dB PAPR in GSM). It is traditionally challenging to design power amplifiers for high PAPR and simultaneously achieve good power efficiency ($\eta$), to the extent that high supply voltages and large standing currents are used to accommodate signal peaks. Approaches to improve high-PAPR $\eta$ fit into established amplifier classes (e.g., Class A, Class B, Class AB, Class G). Some approaches aim to reduce standing current (e.g. Class-B); others reduce supply-voltage overhead (such as Class G that utilizes envelope tracking). There are also load-modulation classes (e.g. Doherty) and switch-mode classes (e.g., E, F). The state of radio frequency (RF) PA design art using these classes alone or in combination achieves relatively acceptable efficiency levels ($\eta$) for narrowband signals with high-PAPR. For example, in a Class G Doherty topology, the amplifier circuit achieves about a 28.8% drain efficiency for a 1 MSym/s 16QAM signal at 3.71 GHz. However, traditional amplification systems lack effective techniques for high-fractional-bandwidth (BW) supply modulation.

Various techniques have been proposed to improve PA average efficiency. Some reduce average bias current, such as Class-AB/B/C; others reduce average supply voltage, such as supply-switching (Class-G), envelope tracking (ET/Class-H) and envelope elimination and restoration (EER). There are also load modulation strategies, like Doherty, outphasing and dynamic load modulation. Switching PAs, e.g. Class-D/E/F, can achieve high peak efficiency. RF PA design art using these schemes alone or in combinations achieves good efficiency for narrowband signals with high PAPR. However, Class-G/ET/EER techniques are limited by supply modulator bandwidth (typically tens of MHz) and modulator circuit power. Existing load modulation techniques and switching techniques often have limited bandwidth due to the use of tuned circuits. Traditional power amplification systems lack effective techniques to enhance efficiency for broadband signals with high PAPR.

To address the challenge, the present disclosure provides for a novel high-speed current-mode instantaneous supply-switching (ISS) technique, combined with a broadband push-push Class-AB PA core. The instantaneous supply switching refers to supply modulation fast enough to follow not only slow envelope variations in a narrowband RF signal, but also fast enough to follow the instantaneous amplitude of a broadband signal with spectral occupancy of many hundreds of MHz.

In the subject technology, the cascode transistors necessary for high-voltage tolerance in a common-source PA are simultaneously used for supply switching, in response to the signal amplitude. A high-voltage supply is selected when the signal amplitude is large, and a low-voltage supply is selected when the signal amplitude is low. The subject technology can theoretically achieve better efficiency than envelope-based supply-modulation schemes (e.g. Class-G/ET/EER). FIGS. 4A-10 will describe and analyze the ISS technique. Problems that were found to arise from high-speed current-mode switching are discussed, together with the solutions that were developed and implemented. Expressions are derived for the ideal efficiency of ISS, including optimization of the supply voltages. These results are expressed in terms of the signal PDF, so that the effectiveness of ISS vs. other PA topologies can be assessed for specific applications. FIGS. 11-14 will describe circuit design details. The resistive shunt-feedback PA core of FIG. 12 is analyzed to derive small-signal characteristics. Auxiliary circuits, including the supply-switching (SS) driver of FIG. 13 and output common-mode impedance control network of FIG. 14 are also described and analyzed.

The present disclosure provides for a current-mode instantaneous supply-switching (ISS) circuit that is incorporated into a Class-AB power amplifier core (e.g., 0.18 µm SiGe BiCMOS process), with a rail-switching rate of about 1 GHz and a power amplifier efficiency (PAE) of about 13.6% for 11 dB PAPR (including a clipped Gaussian signal at ±5$\sigma$). This current-mode supply modulation technique may be embedded in the power amplifier circuit design, without an external tracking supply. The subject technology can switch the active supply rail in response to an instantaneous signal voltage, unlike some prior supply modulation implementations that only respond to either static power-control commands or to the signal envelope tracking. The subject technology may be based on the very high inherent switching bandwidth of the current-mode topology. For example, selecting 7.5/4.5 V as PA core supply rails, the subject technology directed to a 0.18 µm SiGe BiCMOS PA process can achieve a power amplifier efficiency of about 13.6% for a 15-215 MHz noiselike signal, with near-Gaussian PDF voltage distribution and 14 dB PAPR. The subject technology provides for superior efficiency compared to power amplification topologies for large fractional bandwidth, high-PAPR RF signals.

FIG. 1 illustrates an example network environment 100 in which a content distribution system may be implemented in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The example network environment 100 includes a head-end 105, an optical line terminal (OLT) 110, buildings 120A-D, media converters 135A-D, a first transmission network 115, and second transmission networks 125A-D. The buildings 120A-D may be multi-dwelling units (MDUs), houses, offices, or any general structures. In one or more implementations, one or more of the buildings 120A-D may represent a collection of separate structures, such as a subdivision of separate houses. In one or more implementations, the media converters 135A-D generally refer to "fiber nodes," where a transmission media over fiber is redistributed to a transmission media over coaxial cable, and vice versa.

The buildings 120A-D may include multiple gateway devices that are located in different units of the buildings 120A-D, such as different offices, different dwelling units, etc. The gateway devices may be coupled to the media converters 135A-D via the second transmission networks 125A-D and may be coupled to one or more user devices within the different units via local area networks. The second transmission networks 125A-D may include network couplings and/or adapters, such as splitters, and may include any network medium, such as coaxial transmission lines, fiber optic transmission lines, Ethernet transmission lines, power transmission lines, etc. In one or more implementations, the second transmission networks 125A-D may include a non-optical network medium, such as coaxial transmission lines.

In the network environment 100, the second transmission network 125A is represented as a Data Over Cable Service Interface Specification (DOCSIS) network that includes coaxial transmission lines, the second transmission network 125B is represented as a Ethernet over Coxial (EoC) network that includes coaxial transmission lines, the second transmission network 125C is represented as part of a fiber to the home (FTTH) network that includes fiber optic transmission lines, and the second transmission network 125D is represented as a local area network (LAN) that includes Ethernet transmission lines.

The media converters 135A-D may be coupled to the gateway devices via the second transmission networks 125A-D and may be coupled to the OLT 110 via the first transmission network 115. The first transmission network 115 may include one or more network couplings, or adapters, such as splitters, and may include any network medium, such as coaxial transmission lines, fiber optic transmission lines, Ethernet transmission lines, power transmission lines, etc. In one or more implementations, the first transmission network 115 may include an optical network medium and one or more optical splitters. In one or more implementations, the second network medium may be different than the first network medium. In the network environment 100, the first transmission network 115 is represented as a passive optical network (PON) that includes fiber optic transmission lines.

Since the media converters 135A-D are coupled to the gateway devices via the second transmission networks 125A-D, and to the OLT 110 via the first transmission network 115, the media converters 135A-D may convert signals received over the first transmission network 115, such as optical signals, to signals that can be transmitted over the second transmission networks 125A-D, such as electric signals. In one or more implementations, the media converters 135A-D may act as layer-2 bridges, which receive data packets from the OLT 110 of the headend 105 over optical network medium of the first transmission network 115, and bridge the received data packets over the non-optical network medium of the second transmission networks 125A-D to the gateways, and vice-versa.

The headend 105 may include one or more devices, such as network devices, transmitters, receivers, servers, etc., that are part of a content delivery network (CDN) that coordinates the delivery of content items, such as television programs, movies, songs or other audio programs, educational materials, community information, or generally any content items, to the user devices of the buildings 120A-D. The content items may be delivered to the user devices via any content delivery mechanism. The headend 105 may use the OLT 110 to communicate over the first transmission network 115 with the media converters 135A-D.

The media converters 135A-D and the gateway devices may each include local caches, such as hard drives or other memory devices, for storing content items received from the headend 105 that are intended for distribution to the user devices. For example, the headend 105 may transmit content items that are expected to be requested by the user devices, such as popular movies, television shows, etc., to the media converters 135A-D and/or the gateway devices during off-peak hours. For example, if the headend 105 determines that there is a popular television series for which a not-yet-aired episode is expected to be requested by many of the user devices when the episode airs (or otherwise becomes available), the headend 105 may transmit the not-yet-aired episode to one or more of the media converters 135A-D and/or one or more of the gateways during off-peak hours, such as the night before the episode is scheduled to air (or otherwise become available). In this manner, the simultaneous viewing of the episode by many of the user devices the next day will not overwhelm the first transmission network 115 and/or the second transmission networks 125A-D. Similarly, if a user device is accessing an episode television series on-demand, the headend 105 can coordinate caching one or more subsequent episodes to a media converter 135A and/or a gateway device that is upstream from the user device.

In one or more implementations, the headend 105 may receive an indication from a third party server, such as a content provider server, that a particular content item is expected to be requested by multiple user devices. For example, the headend 105 may receive an indication from an audio content provider that an upcoming release of a song and/or album of a certain artist or style is expected to be requested by many of the user devices. The headend 105 may then transmit the song and/or album to the media converters 135A-D and/or the gateway devices in advance of the release date, such as the night before, e.g. an during off-peak, or low traffic, time period.

Figure 2:
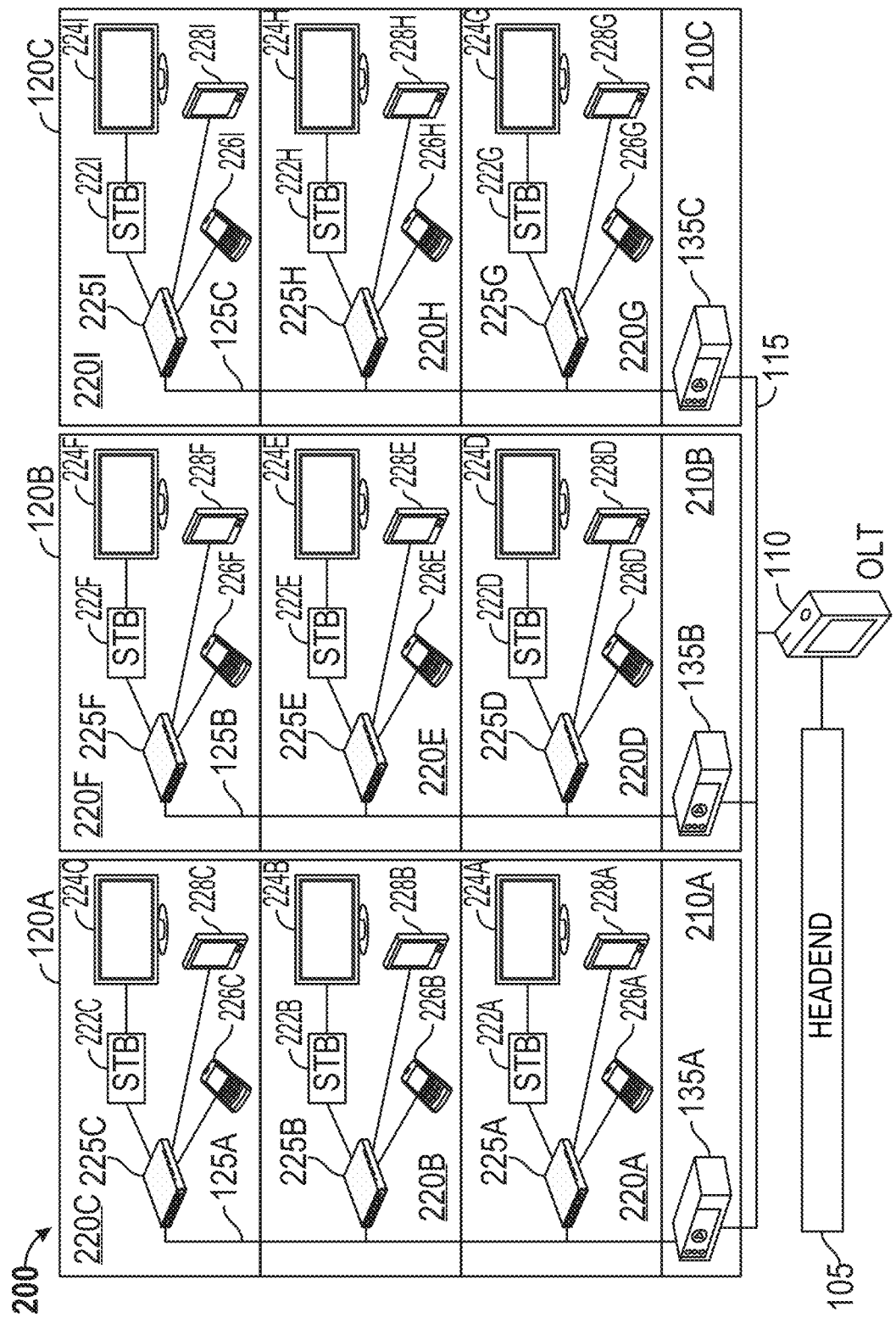
FIG. 2 illustrates an example network environment in which a content distribution system having a power amplifier with supply switching may be implemented in accordance with one or more implementations.

FIG. 2 illustrates an example network environment 200 in which a content distribution system may be implemented in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The example network environment 200 includes the headend 105, the OLT 110, the buildings 120A-C, the first transmission network 115 and the second transmission networks 125A-C. The buildings 120A-C include utility areas 210A-C and units 220A-I. The units 220A-I may include gateway devices 225A-I, electronic devices 222A-I, 226A-I, 228A-I, and display devices 224A-I.

The utility areas 210A-C may be common areas of the buildings 120A-C, e.g. areas of the buildings 120A-C that are accessible to utility operators, such as broadband service providers. In one or more implementations, the utility areas 210A-C may be in the basement of the buildings 120A-C or external to the buildings 120A-C. The units 220A-I of the buildings 120A-C may be dwelling units, office spaces, or generally any delineated structures within the buildings 120A-C. In one or more implementations, one or more of the buildings 120A-C may represent a collection of physically separate units 220A-I, such as a subdivision of separate houses.

The gateway devices 225A-I may include a network processor or a network device, such as a switch or a router, that is configured to couple the electronic devices 222A-I, 226A-I, 228A-I to the headend 105 via the media converters 135A-C. The gateway devices 225A-I may include local area network interfaces, such as wired interfaces and/or wireless access points, for communicating with the electronic devices 222A-I, 226A-I, 228A-I. The gateway devices 225A-I may include a local cache for caching content items and/or portions of content items, and the gateway devices 225A-I may include distribution control modules for coordinating the caching of the content items.

The electronic devices 222A-I, 226A-I, 228A-I can be computing devices such as laptop or desktop computers, smartphones, personal digital assistants ("PDAs"), portable media players, set-top boxes, tablet computers, televisions or other displays with one or more processors coupled thereto and/or embedded therein, or other appropriate computing devices that can be used for adaptive bit rate streaming, and rendering, of multimedia content and/or can be coupled to such a device. In the example of FIG. 2, the electronic devices 222A-I are depicted as set-top boxes (STBs) that are coupled to display devices 224A-I, such as televisions, the electronic devices 226A-I are depicted as smart phones, and the electronic devices 226A-I are depicted as tablet devices. In one or more implementations, any of the electronic devices 222A-I, 226A-I, 228A-I may be referred to as a user device and any of the electronic devices 222A-I, 226A-I, 228A-I may be, or may include one or more components of, the electronic system that is discussed below with respect to FIG. 16.

As shown in FIG. 2, the headend 105, media converters 135A-C, gateway devices 225A-I, and electronic devices 222A-I, 226A-I, 228A-I are arranged in a hierarchical tree network arrangement such that the headend 105 is directly coupled to the media converters 135A-C, the media converter 135A is directly coupled to the gateway devices 225A-C, the media converter 135B is directly coupled to the gateway devices 225D-F, the media converter 135C is directly coupled to the gateway devices 225G-I, the gateway device 225A is directly coupled to the electronic devices 222A, 226A, 228A, the gateway device 225B is directly coupled to the electronic devices 222B, 226B, 228B, etc. In other words, the headend 105 is located directly upstream from the media converters 135A-C, the media converter 135A is located directly upstream from the gateway devices 225A-C, the media converter 135B is located directly upstream from the gateway devices 225D-F, the media converter 135C is located directly upstream from the gateway devices 225G-I, the gateway device 225A is located directly upstream from the electronic devices 222A, 226A, 228A, the gateway device 225B is located directly upstream from the electronic devices 222B, 226B, 228B, etc.

The media converters 135A-C and/or the gateway devices 225A-I, may each include a cache, such as a hard drive or other memory device, that stores content items, and/or portions thereof, intended for distribution from the headend 105 to one or more of the electronic devices 222A-I, 226A-I, 228A-I. Thus, the caching of the content items is distributed across two layers of network nodes in the hierarchical network arrangement, first the media converters 135A-C and then the gateway devices 225A-I. If a content item that is cached by a media converter 135A or a gateway device 225A is requested by an electronic device 222A, the content item is provided to the electronic device 222A by the media converter 135A or the gateway device, rather than by the headend 105, thereby conserving upstream bandwidth.

The headend 105 may communicate with distribution control modules of the media converters 135A-C to coordinate caching the content items at the media converters 135A-C. The distribution control modules of the media converters 135A-C may also coordinate the caching of content in the subset of the downstream gateway devices 225A-I that are directly coupled to the media converters 135A-C. For example, the media converter 135A may coordinate the caching of content in the gateway devices 225A-C. The distribution control modules of the media converters 135A-C may communicate with distribution control modules of the gateway devices 225A-I to coordinate caching content items at the gateway devices 225A-I. The headend 105 and the distribution control modules of the media converters 135A-C and the gateway devices 225A-I are discussed further below with respect to FIG. 3.

The headend 105 and/or the distribution control modules of the media converters 135A-C may control the distribution of the caching such that content items, or portions thereof, that are expected to be requested by one or more of the electronic devices 222A-I, 226A-I, 228A-I are cached at the media converters 135A-C and/or the gateway devices 225A-I that service, e.g. are directly upstream from, the electronic devices 222A-I, 226A-I, 228A-I, prior to the content items, or portions thereof, being requested by the electronic devices 222A-I, 226A-I, 228A-I. For example, when an electronic device 222A requests a content item, or a portion thereof, from the headend 105 that is cached at the gateway device 225A, or the media converter 135A, that services the electronic device 222A, the gateway device 225A or media converter 135A can intercept the request, e.g. since the request will be transmitted to the headend 105 via the gateway device 225A and the media converter 135A, and the gateway device 225A or the media converter 135A can provide the cached content item, or portion thereof, to the electronic device 222A, instead of transmitting the request back to the headend 105. In this manner requested content items can be provided to the electronic devices 222A-I, 226A-I, 228A-I from a proximal network node, thereby reducing upstream congestion.

In one more implementations, the headend 105, and/or the distribution control modules of the media converters 135A-C and/or the gateway devices 225A-I may collectively maintain a cache directory of cached content items. The cache directory may be locally stored at the headend 105, and/or at the distribution control modules of one or more of the media converters 135A-C and/or the gateway devices 225A-I. The cache directory may include, for example, an identification of each cached content item, or portion thereof, and a network identifier, such as a uniform resource locator (URL), for accessing the content item, or portion thereof. The gateway devices 225A-I and/or the media converters 135A-C may utilize content redirection techniques, such as hypertext transport protocol (HTTP) redirection techniques, to allow the electronic devices 222A-I, 226A-I, 228A-I to access content items that are cached at the media converters 135A-C and/or at the gateway devices 225A-I that are not directly upstream from the electronic devices 222A-I, 226A-I, 228A-I.

For example, a gateway device 225D and/or a media converter 135B that are located directly upstream from an electronic device 222D may intercept a request for a content item, or portion thereof, from the electronic device 222D. If the requested content item is not cached at the gateway device 225D or the media converter 135B, the gateway device 225D and/or the media converter 135B may determine, based on the locally stored cache directory, whether the requested content item is cached at another media converter 135A,C or gateway device 225A-C, E-I. If the requested content item is cached at another media converter 135A,C or gateway device 225A-C, E-I, the gateway device 225D and/or the media converter 135B may utilize an HTTP redirection technique to redirect the request of the electronic device 222D from the headend 105 to the another media converter 135A,C or gateway device 225A-C, E-I, such as the media converter 135A.

The headend 105 may partition the electronic devices 222A-I, 226A-I, 228A-I into groups based on the content items that are expected to be requested by the electronic devices 222A-I, 226A-I, 228A-I. For example, the electronic devices 222A-I, 226A-I, 228A-I may be partitioned into groups based on characteristics associated with the electronic devices 222A-I, 226A-I, 228A-I and/or characteristics associated with the users interacting with the electronic devices 222A-I, 226A-I, 228A-I, such as the level of service, e.g. channel tier, accessible to the electronic devices 222A-I, 226A-I, 228A-I, e.g. via subscriptions, the physical locations of the electronic devices 222A-I, 226A-I, 228A-I, the demographics of the users interacting with the electronic devices 222A-I, 226A-I, 228A-I, content items previously accessed by the electronic devices 222A-I, 226A-I, 228A-I, such as episodes of a serial television program, or generally any characteristics that are indicative of content items that may be requested in the future by the electronic devices 222A-I, 226A-I, 228A-I.

For a given group of the electronic devices 222A-I, 226A-I, 228A-I, such as the group of the electronic devices 222A-I, 226D-F, 228D-F that can access a particular channel tier, the headend 105 may determine one of the media converters 135A-C that provides service to, e.g. is directly upstream from, the largest number of the electronic devices 222A-I, 226D-F, 228D-F in the group. Since the media converter 135B provides service to nine out of fifteen of the electronic devices 222A-I, 226D-F, 228D-F in the group, e.g. the electronic devices 222D-F, 226D-F, 228D-F, the headend 105 may determine the media converter 135B.

Once the media converters 135A-C receive content items, and/or portions thereof, to be cached from the headend 105, the distribution control modules of the media converters 135A-C may identify content items that can be cached downstream at one or more of the gateway devices 225A-I, such as content items that are only expected to be accessed by a single electronic device 222A. The media converters 135A-C may determine that a particular content item is only expected to be accessed by a single electronic device 222A based at least in part on content access patterns of the electronic devices 222A-I, 226D-F, 228D-F in the group. In one or more implementations, the content access patterns of the electronic devices 222A-I, 226D-F, 228D-F in the group may be determined by one or more of the media converters 135A-C and/or the gateway devices 225A-I, by sniffing the network protocol messages that pass through the media converters 135A-C and/or gateway devices 225A-I. The distribution control modules of the media converters 135A-C may coordinate moving these content items from the cache of the media converters 135A-C to the cache of one or more of the gateway devices 225A-I. The distribution controllers of the media converters 135A-C may then coordinate with the distribution server of the headend 105 to receive additional content items, or portions thereof, to cache, e.g. in the cache space vacated by pushing the content item down to the one or more gateway devices 225A-I.

For example, a media converter 135B may determine that a content item can be cached at one of the gateway devices 225A-I, such as the gateway device 225D, when the content item is expected to be primarily accessed by the electronic devices 222D, 226D, 228D that are directly downstream from the gateway device 225D. In one or more implementations, a content item may be cached at a gateway device 225D if the content item is expected to be primarily accessed by the electronic devices 222D, 226D, 228D that are directly downstream from the gateway device 225D, and/or by the electronic devices 222E-F, 224E-F, 228E-F that are directly downstream from the gateway devices 225E-F that are directly coupled to the gateway device 225D, e.g. via the second transmission network 125B.

In one or more implementations, distribution control modules of the gateway devices 225A-I may communicate directly with the headend 105, e.g. via a distribution control module of one of the media converters 135A-C, in order to coordinate caching content items on the gateway device that are expected to be accessed by electronic devices 222A-I, 226A-I, 228A-I that are served by the gateway device, such as based on content access patterns of the electronic devices 222A-I, 226A-I, 228A-I. For example, if a gateway device 225A includes, or is coupled to, a set-top box that is configured to record a television show on a weekly basis, the gateway device 225A may coordinate with the headend 105 in order to have the television program cached on the gateway device 225A prior to its air time, e.g. during off-peak hours. Similarly, if an electronic device 222A is accessing an episode of a television series on-demand via a gateway device 225A, the gateway device 225A may coordinate with the headend 105 to cache subsequent episodes of the television series, e.g. during off-peak hours. In one or more implementations, the gateway device 225A may determine the content access patterns of the electronic devices 222A, 226A, 228A served by the gateway device 225A by sniffing the network protocol messages that pass through the gateway device 225A.

Figure 3:
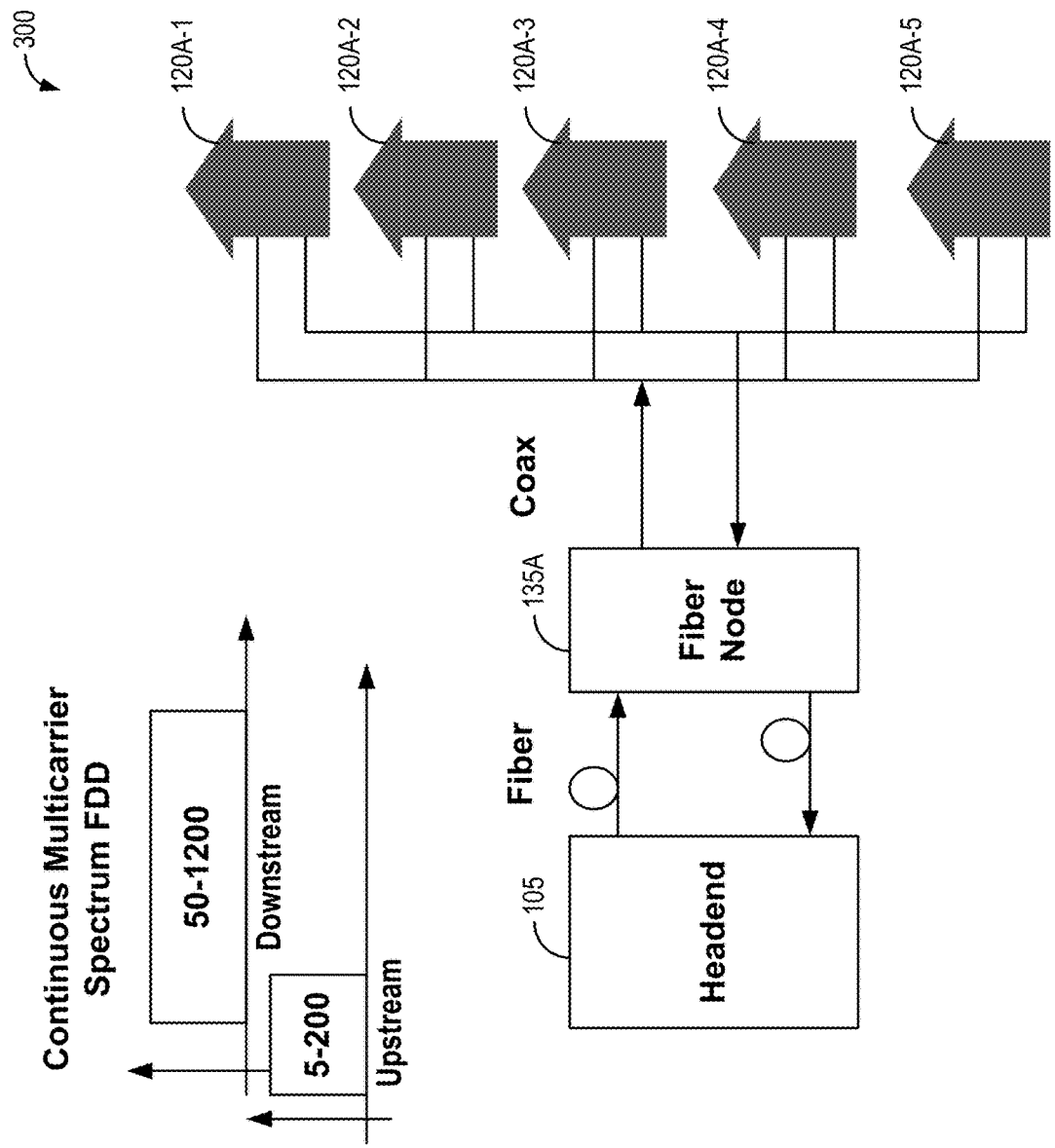
FIG. 3 illustrates an example CATV distribution architecture having a power amplifier with supply switching may be implemented in accordance with one or more implementations.
Figure 4:
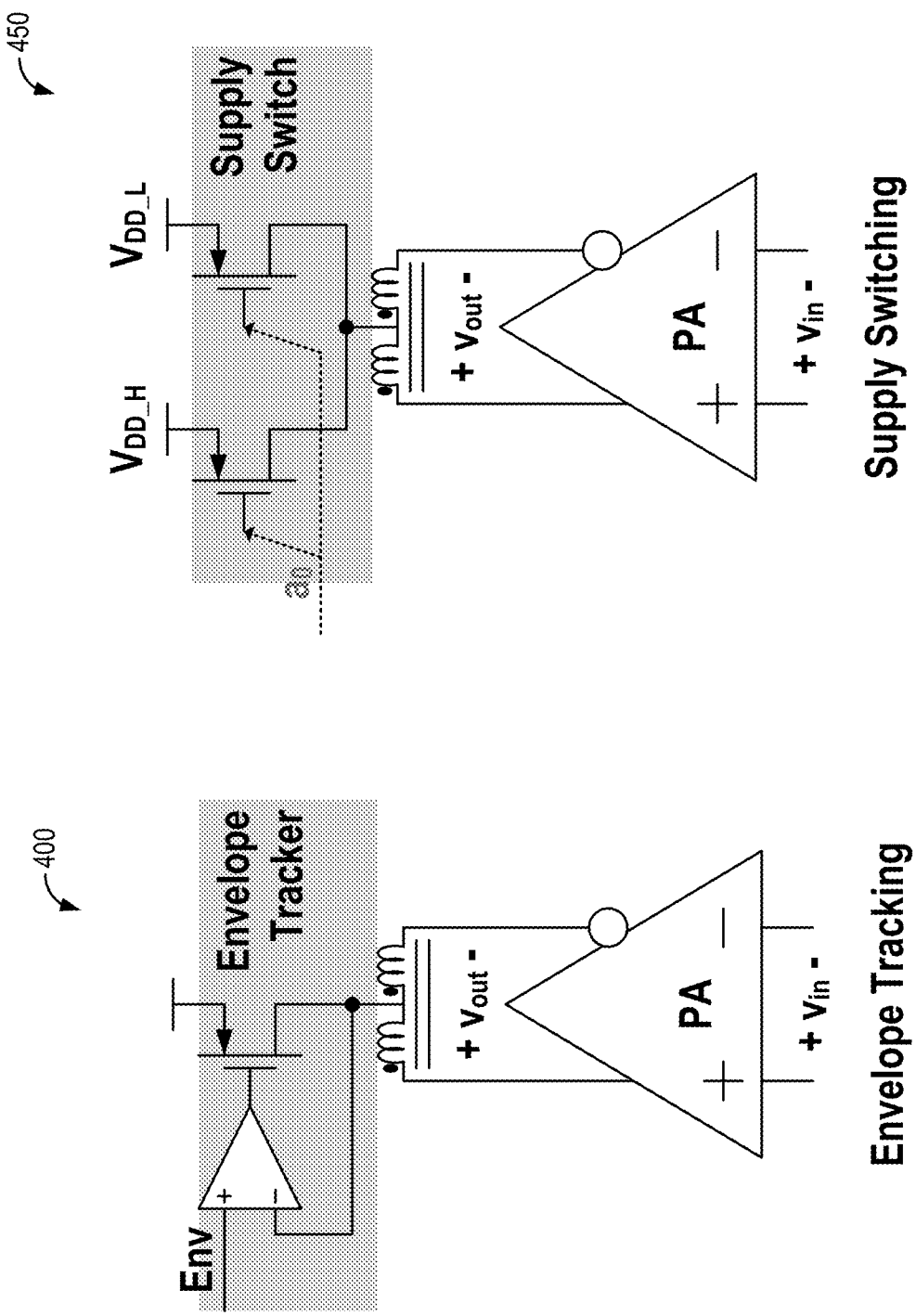
FIGS. 4A and 4B illustrate examples of traditional supply modulation techniques in accordance with one or more implementations.

FIG. 3 illustrates the layout of a traditional hybrid optical-fiber/coaxial cable CATV distribution architecture. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Note that customer-premise cable modems and set-top boxes in a community communicate with a "fiber node" or media converter 135A, via a shared coaxial cable. The fiber node then communicates two-way traffic with the cable headend, similar in function to the wireline telephone central office. The bidirectional QAM signals often have a high PAPR, up to 14 dB. The DOCSIS 3.1 standard also requires high fractional bandwidth and output power. It uses frequency bands of approximately 5-200 MHz and 50-1200 MHz for Upstream (customer to headend) and Downstream (headend to customer) signals, respectively. Typical cable modems require Upstream peak output power of about 1 W. Typical fiber nodes require Downstream peak power of about 10 W, and may use costly GaAs or GaN PAs. CATV signals generally have higher PAPR and fractional bandwidth than Wi-Fi protocol signals (e.g. 802.11.ac). Conventional power amplifiers commonly have low efficiency under high PAPR conditions, because of the high supply voltages and large bias currents necessary to avoid clipping the signal peaks. This leads to higher costs for power supplies, thermal management and battery backup. Existing PA products for such applications may apply Class-A design, which achieves at best 4% average efficiency, as we will show. It is therefore desirable to extend the PA design topology for high PAPR/high fractional bandwidth signals.

The media converter 135A may include one or more power amplifiers may be highly linear and therefore desirable for output stage amplification in radio frequency (RF) transmitters, for example. However, the linearity of the power amplifier comes at the expense of low power efficiencies. These power efficiencies are further reduced in the case of typical broadband communication signals. For example, many broadband communication signals include multiple orthogonal carriers (e.g., OFDM, LTE, MoCA, etc.) and thus have a Gaussian or substantially Gaussian amplitude probability density function (PDF) and high PAPR. Typical efficiencies of the power amplifier implemented as a class A or class B amplifier for such signals approach approximately 1-2% and 10-30% respectively for peak events of the signals.

Common approaches for improving the power efficiency of a transmitter output stage include varying the power supply provided to the stage as a function of the amplitude of the input signal. For example, an existing solution tracks the envelope of the input signal and modulates the power supply using a switching regulator based on the input signal envelope. However, this approach is bound by the maximum bandwidth of the switching regulator (e.g., 20 MHz) and, therefore, is inefficient for broadband communication signals (e.g., LTE, modern cable TV signals, etc.).

The media converter 135 (or fiber node) may utilize a broadband power amplifier that combines, for example, a Class AB core with instantaneous supply switching (e.g., current mode). The media converter 135 may include high-bandwidth ($f_t$) two-stage amplifiers (e.g., BJT cascodes) that may switch the amplifier signal current to high supply rails or low supply rails depending on instantaneous amplitude. The media converter 135 may provide current-mode switching at gigahertz rates, which may enhance efficiency for bandwidths beyond existing envelope trackers. In one or more implementations, a 1.35 W peak power and/or efficiency=13.6% at 11 dB peak-to-average-power ratios (PAPR) may be observed. The combination of the output power ($P_{out}$), large fractional bandwidth and high-PAPR efficiency may provide benefits over conventional power amplification systems.

In one or more implementations, the power amplifier includes a capacitive coupling combiner circuit, a first bipolar junction transistor (BJT) circuit, a second BJT circuit, a common-mode controller circuit, a resistive feedback circuit, a biasing circuit, and a supply switching driver.

FIGS. 4A and 4B illustrate examples of traditional supply modulation techniques in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Supply modulation is an established category of techniques for amplifier efficiency enhancement. The PA supply is modulated dynamically in response to some signal parameter in order to save DC power. Two prior supply modulation approaches are illustrated in FIGS. 4A and 4B. One is envelope tracking 400 (FIG. 4A), where the supply follows the signal envelope continuously; another is conventional voltage-mode supply switching 450 (FIG. 4B), where the supply changes in discrete steps in response to the envelope. However, both approaches require high driving power for the large top-side PMOS devices. They also suffer from limited supply modulation bandwidth as mentioned earlier. ET is limited by the switch-mode power supply bandwidth, and voltage-mode SS is limited by $CV^2f$ losses due to rapid switching of parasitic capacitances.

The limited bandwidth of existing supply modulation techniques constrains the potential efficiency improvement. For example, it may not be possible to use the full signal envelope as input to the supply modulator. The envelope may require smoothing (low-pass filtering) of some form to match the modulator bandwidth. The modulated supply may then be forced to remain closer to its maximum value to prevent clipping after sudden jumps in the envelope. CATV signals have bandwidths on the order of 1 GHz, much greater than contemporary cellular or WAN signal formats. High-speed supply modulation is therefore desirable in CATV applications, but also relevant to future wireless applications as standards incorporate higher bandwidth signals. To resolve these drive power and bandwidth issues, a current-mode supply-switching technique is provided in the present disclosure, which will be discussed in further detail in FIG. 5.

Figure 5:
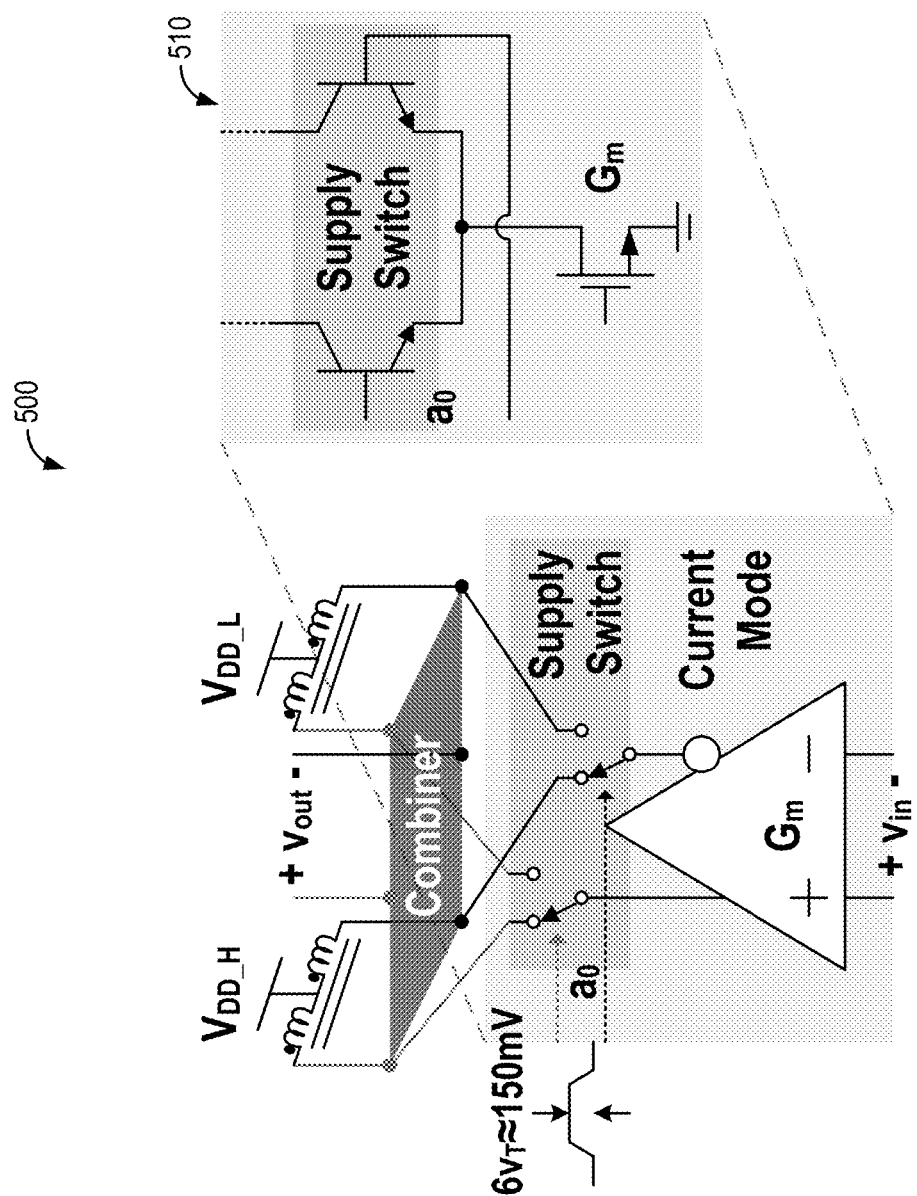
FIG. 5 illustrates an example of a current-mode supply switching circuit that may be implemented in accordance with one or more implementations.

FIG. 5 illustrates an example of a current-mode supply switching circuit 500 that may be implemented in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In FIG. 5, the current-mode supply switching circuit 500 includes a BJT current-mode switch that is integrated in a push-push differential PA, switching the current between $V_{DD\_H}$ and $V_{DD\_L}$. In one or more implementations, the current-mode switches 510 are also the cascode devices, which serve to increase gain and protect the low-voltage NMOS input devices. Therefore, there is almost no extra cost for the switches. Unlike traditional approaches, where the PMOS top-side switch has to be large enough to prevent excessive voltage drop, the BJT current-mode switch may only need to meet current density and linearity requirements, and can be much smaller with reduced parasitics. The embedded BJTs also has naturally high $f_t$, compared to embedded or external PMOS devices, and this also contributes to reduced parasitics. Another advantage of the current-mode supply switching circuit 500 is that only $6v_T \cong 150$ mV may be utilized for driving the BJT current-mode switch, which is much smaller than the typical gate drive that would be required for a top-side PMOS switch. In turn, the smaller switch size and smaller driving voltage contribute to lower drive power and better efficiency.

FIGS. 6A-6C illustrate an example a traditional supply modulator 600 compared to an instantaneous supply switching circuit 640. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In one or more implementations, instantaneous supply switching represents that the PA selects its supply depending on the instantaneous magnitude of an input signal, rather than its envelope. If the magnitude of the signal is greater than a predetermined threshold $V_{TH}$, $V_{DD\_H}$ is selected; otherwise, $V_{DD\_L}$ is selected.

In FIG. 6C, the plot 680 depicts a sinusoidal signal with peak amplitude greater than $V_{TH}$ and three envelope steps for illustration. When the envelope is smaller than the $V_{TH}$, $V_{DD\_L}$ is always selected. When the envelope is greater than $V_{TH}$, there are some moments that the magnitude is larger than $V_{TH}$ and some instances of time when it is smaller than $V_{TH}$. A major difference between the traditional supply modulator 600 and the instantaneous supply switching 640 is that at these moments, the supply is switched to $V_{DD\_L}$ to save DC power. In this respect, efficiency limitations of traditional linear Pas can be overcome. For example, an ideal Class-A PA has an efficiency upper bound of 50% for sinusoids. If the instantaneous supply switching 640 is applied to a Class-A PA, an efficiency greater than 50% for sinusoids can be achieved. In other words, the instantaneous supply switching 640 (or current-mode supply switching) can achieve better efficiency than traditional supply switching and envelope tracking for constant-envelope signals.

Note that current-mode supply switching can also be applied to high-speed envelope tracking. In one or more implementations, the magnitude of the input signal represents a magnitude within an envelope tracking. For example, if the input signal has a high center frequency (e.g., 20 GHz), the envelope signal can be centered at 20 GHz, using current-mode switching to get more out of the envelope tracking functionality.

Furthermore, more than two supply levels can be used, for further efficiency improvement. A disadvantage of additional supply levels (besides complexity) is the extra parasitic capacitance that will be seen at the output nodes due to BJT collector-base and collector-substrate capacitance.

Figure 7A:
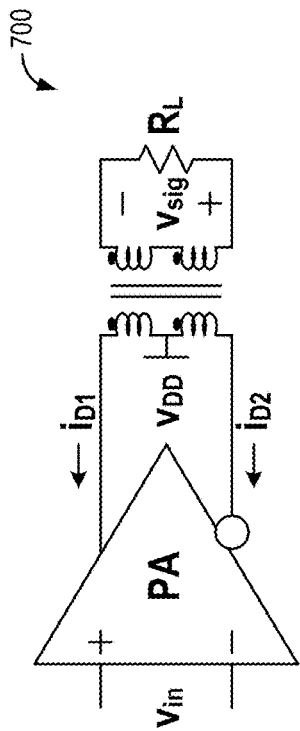
FIGS. 7A and 7B illustrate an example of a differential push-push power amplifier and an efficiency plot in accordance with one or more implementations.
Figure 7B:
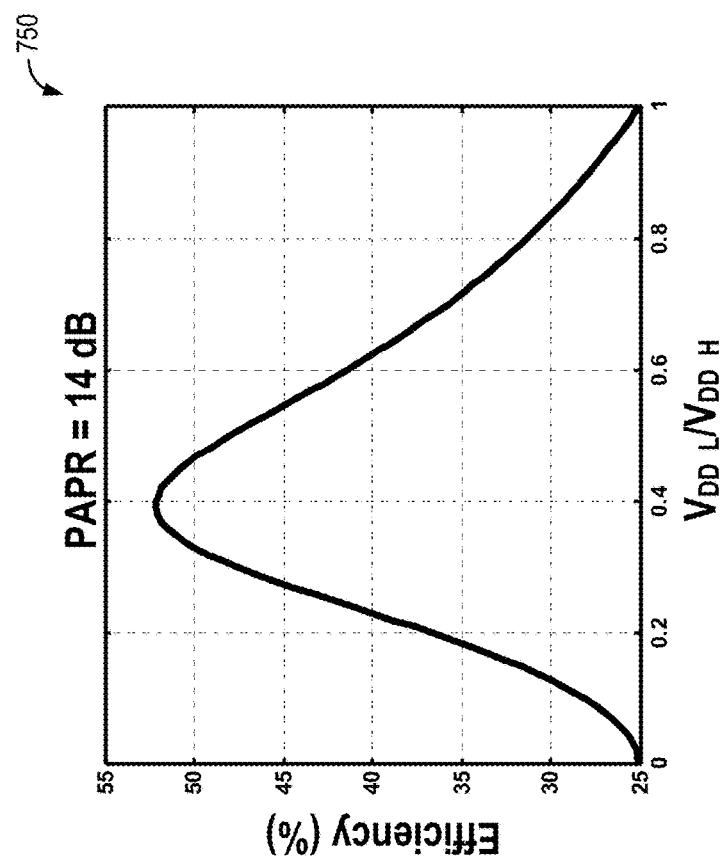

FIGS. 7A and 7B illustrate an example of a differential push-push power amplifier 700 and an efficiency plot 750 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In FIG. 7B, the efficiency plot 750 illustrates an example of ideal efficiency for the target DOCSIS 3.1 CATV signals as a function of the switching supply, assuming zero excess voltage and current headroom and an infinite supply switching rate. The ideal efficiency between Class-A, Class-B, and Class-B can be compared to the instantaneous supply switching by considering the differential push-push PA topology (e.g., 700) in FIG. 7A. DOCSIS 3.1 uses OFDM multi-carrier QAM signals. Multicarrier signals tend to have near-Gaussian voltage probability density functions, due to the Central Limit Theorem. True Gaussian signals have infinite PAPR, with very infrequent large peaks. OFDM signals will have some naturally bounded PAPR, depending on the details of the signal format. For practical purposes, the peak voltage ($v_{peak}$) in FIG. 7B is clipped to five standard deviations ($\sigma = v_{rms}$), which leads to about 14 dB PAPR. Here, PAPR is defined as $(v_{peak}/v_{rms})^2$ instead of $(v_{peak}/v_{rms})^2/2$. The latter definition is the ratio of the average power of a full-amplitude sinusoid to the average power of the actual signal. Clipping to five standard deviations does not significantly degrade the performance of DOCSIS 3.1 systems.

In the Class-A case, $V_{DD}$ must be greater than $v_{peak}/2$ and $i_{bias}$ must be greater than $2v_{peak}/R_L$, therefore the minimum DC power ($P_{DC}$) to avoid clipping is $v_{peak}^2/R_L$. The average output power ($P_{out}$) is $v_{rms}^2/R_L$. Hence, the average power efficiency ($\eta$) is $v_{rms}^2/v_{peak}^2 = 1/\text{PAPR}$. For a target signal (PAPR=14 dB, or a linear power ratio of 25:1), Class-A can ideally achieve 1/25=4% efficiency.

In the Class-B case, the $V_{DD}$ limit is same as for Class-A. The current follows the signal: $i_{bias}=2|v_{sig}|/R_L$. The minimum average $P_{DC}$ is therefore:

$$P_{DC} = V_{DD} \int_{-v_{peak}}^{v_{peak}} i_{bias} f(v_{sig}) dv_{sig} = \sqrt{\frac{2}{\pi}} v_{peak} \frac{v_{rms}}{R_L},, \quad \text{Equation (1)}$$

where $f(v_{sig})$ is the PDF of the Gaussian-distributed output voltage signal, and $\eta = \sqrt{\pi/(2 \cdot \text{PAPR})}$. For our target signals, Class-B can achieve 25% theoretical efficiency.

In the operating mode using current-mode supply switching, where Class-B is implemented with instantaneous supply switching, $i_{bias}$ is same as for Class-B. In one or more implementations, $V_{DD\_H}$ is greater than $v_{peak}/2$. In some implementations, the supply-rail transitions occur when $V_{out} = 2V_{DD\_L}$. The minimum average $P_{DC}$ is then:

$$P_{DC} = \int_0^{2V_{DD\_L}} 2V_{DD\_L} i_{bias} f(v_{sig}) dv_{sig} + \int_{2V_{DD\_L}}^{v_{peak}} 2V_{DD\_H} i_{bias} f(v_{sig}) dv_{sig} \quad \text{Equation (2)}$$

FIG. 7B illustrates a plot depicting ideal efficiency versus $V_{DD\_L}$. For the target signal, Class-B with instantaneous supply switching can achieve 52% efficiency when the optimum value of $V_{DD\_L}$ is chosen. This is significantly more efficient than conventional Class-A and Class-B efficiency under such high PAPR conditions. The efficiency plot 750 shows that $V_{DD\_L}$ cannot be too low, otherwise the supply would barely switch. It also cannot be too high; otherwise no power would be saved.

Figure 8:
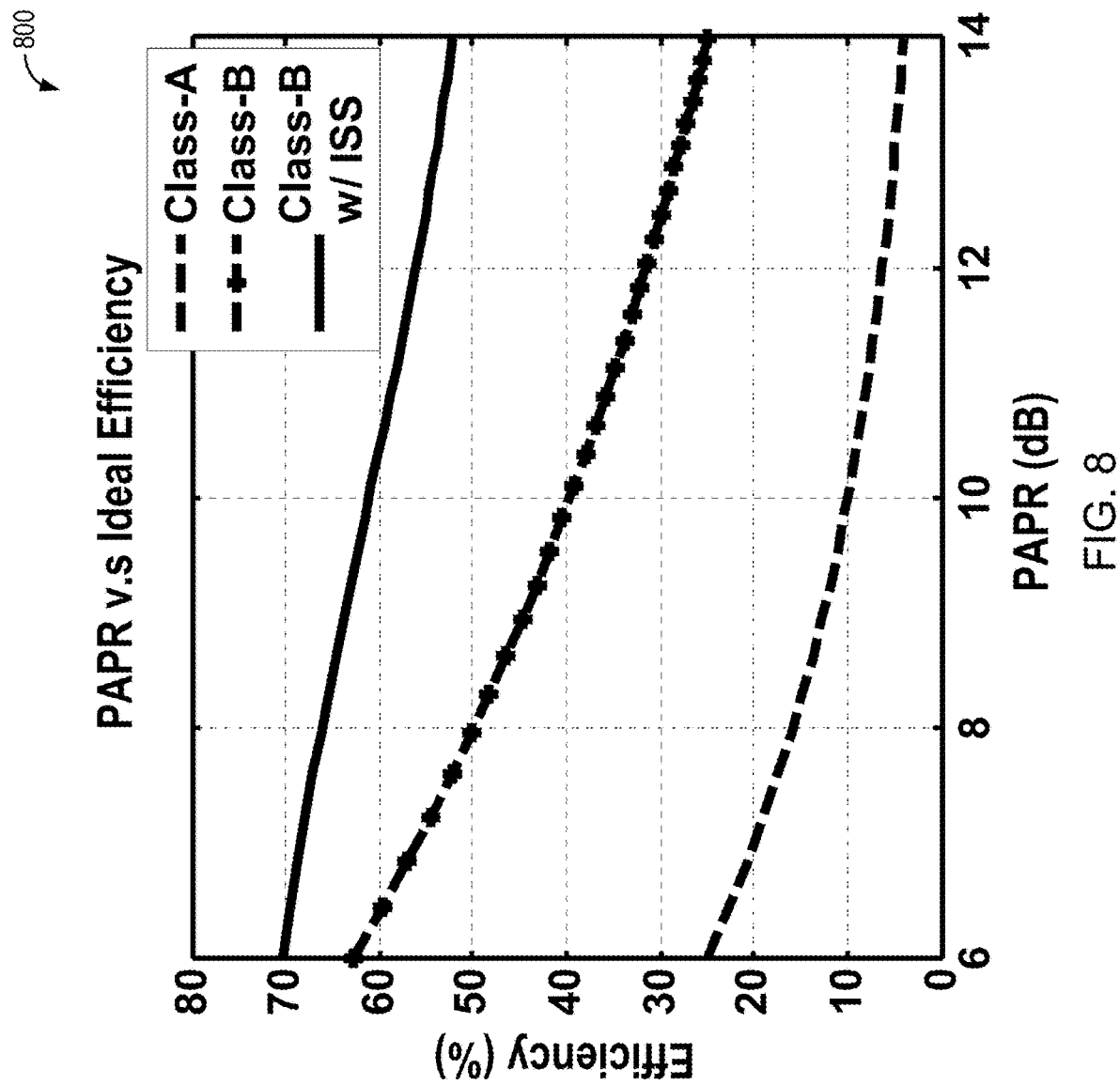
FIG. 8 illustrates an example of an efficiency metric as a Gaussian-distributed signal.

FIG. 8 illustrates an example of an efficiency metric as a Gaussian-distributed signal. In one or more implementations, the efficiency metric indicates PAPR compared to achievable efficiency for a Gaussian distributed signal, where the instantaneous supply switching is strongly advantageous relative to Class-A and Class-B for high-PAPR signals.

Figures 9A, 9B:
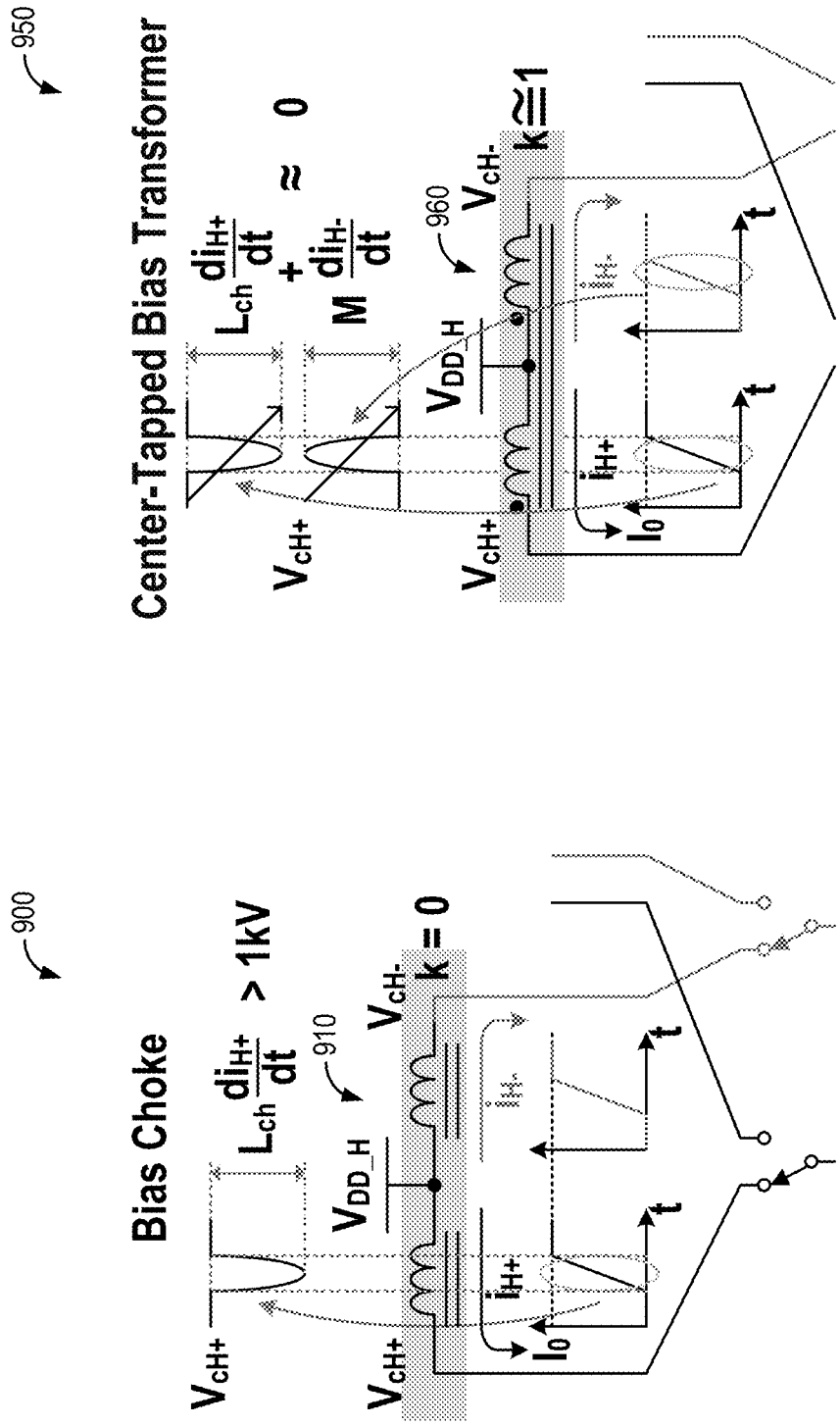
FIGS. 9A and 9B illustrate an example of a traditional supply modulator with a choke bias and an instantaneous supply switching circuit with a center-tapped bias transformer in accordance with one or more implementations.

FIGS. 9A and 9B illustrate an example of a traditional supply modulator 900 with a choke bias and an instantaneous supply switching circuit 950 with a center-tapped bias transformer in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

One major potential issue for current-mode instantaneous supply switching is the magnetic flux change in the bias chokes while rail switching. As shown in the FIG. 9A, if the PA 900 is biased with conventional RF chokes and the current is switched from one rail to another, the BJT collector nodes experience very large voltage jumps due to Ldi/dt. For example, in a typical broadband PA design using bias chokes with value of about 3 µH, with current switching threshold of about 100 mA and a transition time of about 250 ps, the flux change would theoretically cause an undesirable voltage jump greater than 1 kV.

This issue is resolved first by using a center-tapped bias transformer (e.g., 960) instead of individual chokes (e.g., 910). As the current switches from one rail to the other, the sum of the currents in transformer windings remains constant. Because the transformer windings are coupled with k=1 (ideally), there is no net flux change and, therefore, no voltage jump occurs during a rail transition. The center-tapped transformer 960 is utilized to reject Class-AB common-mode current changes, so the addition of the center-tapped transformer 960 does not impose an additional cost.

When the current is switching from $V_{DD\_L}$ to $V_{DD\_H}$, the $V_{ch+}$ node has a flux change and voltage jump due to the left inductor, which is same as the jump that occurs using an RF choke. Because of the mutual coupling, there is another flux change with the same amplitude but with opposite direction. These two flux changes cancel each other out. Note that in CATV applications, a ferrite-core transformer is required due to the low frequency cutoff (5 MHz); but in wireless applications, an on-chip transformer could be used. Another way to understand this is that the center-tapped transformer 960 has a high differential-mode impedance from self-inductance ($L_{ch}$) plus mutual-inductance (M), but low common-mode impedance from $L_{ch}$ minus M. The supply switching operates on the common mode, and the low impedance of the transformer fixes the flux change issue.

Figure 10:
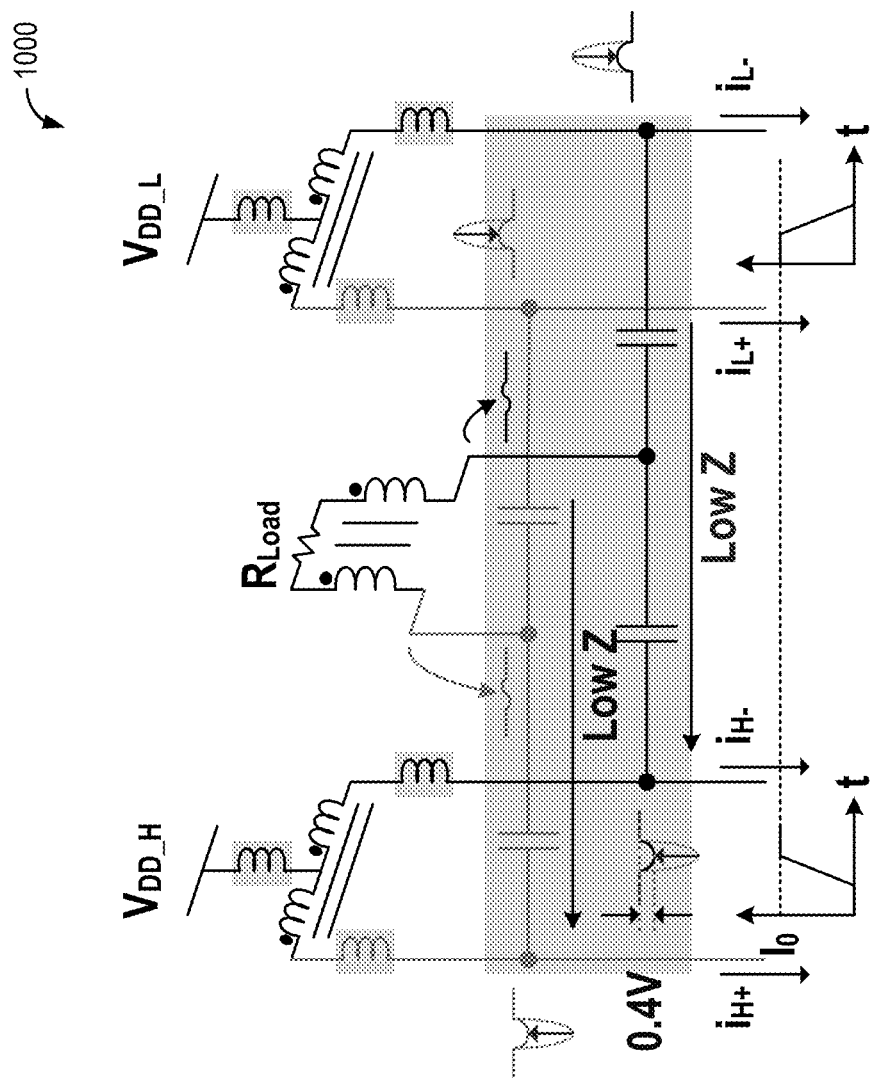
FIG. 10 illustrates an example of an instantaneous supply switching circuit with a capacitive coupling combiner in accordance with one or more implementations.

In practice, the center-tapped bias transformer 960 has parasitic leakage inductance due to its package leads and also due to PCB traces, IC traces, bond wires, etc. The small-signal equivalent model is shown in FIG. 10. The parasitic leakage inductance was modeled as 2 nH in series with each transformer lead, including the center tap. The residual voltage jump due to flux changes in the leakage inductances is about 2.4 V. Large voltage jumps can encroach on the device headroom significantly, affecting efficiency and linearity.

FIG. 10 illustrates an example of an instantaneous supply switching circuit with a capacitive coupling combiner 1000 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

To resolve the residual flux change issue, the capacitive coupling combiner 1000 is implemented, as shown in FIG. 10. The combiner 1000 is composed of two large equal-size capacitors between $V_{DD\_H}$ and $V_{D\_L}$ branches. The large capacitors maintain low impedance over the full frequency range. Note that the voltage jumps due to flux changes across the capacitors are equal and opposite. The low-impedance capacitive path between the two rails allows these jumps to offset each other. The voltage jumps due to flux changes in the parastic inductances are reduced from 2.4 V to 0.4 V at the BJT collector nodes. Since the collector jumps are equal and opposite, the jump at the midpoint of the split and at the load is less than 10 µV.

Figure 11:
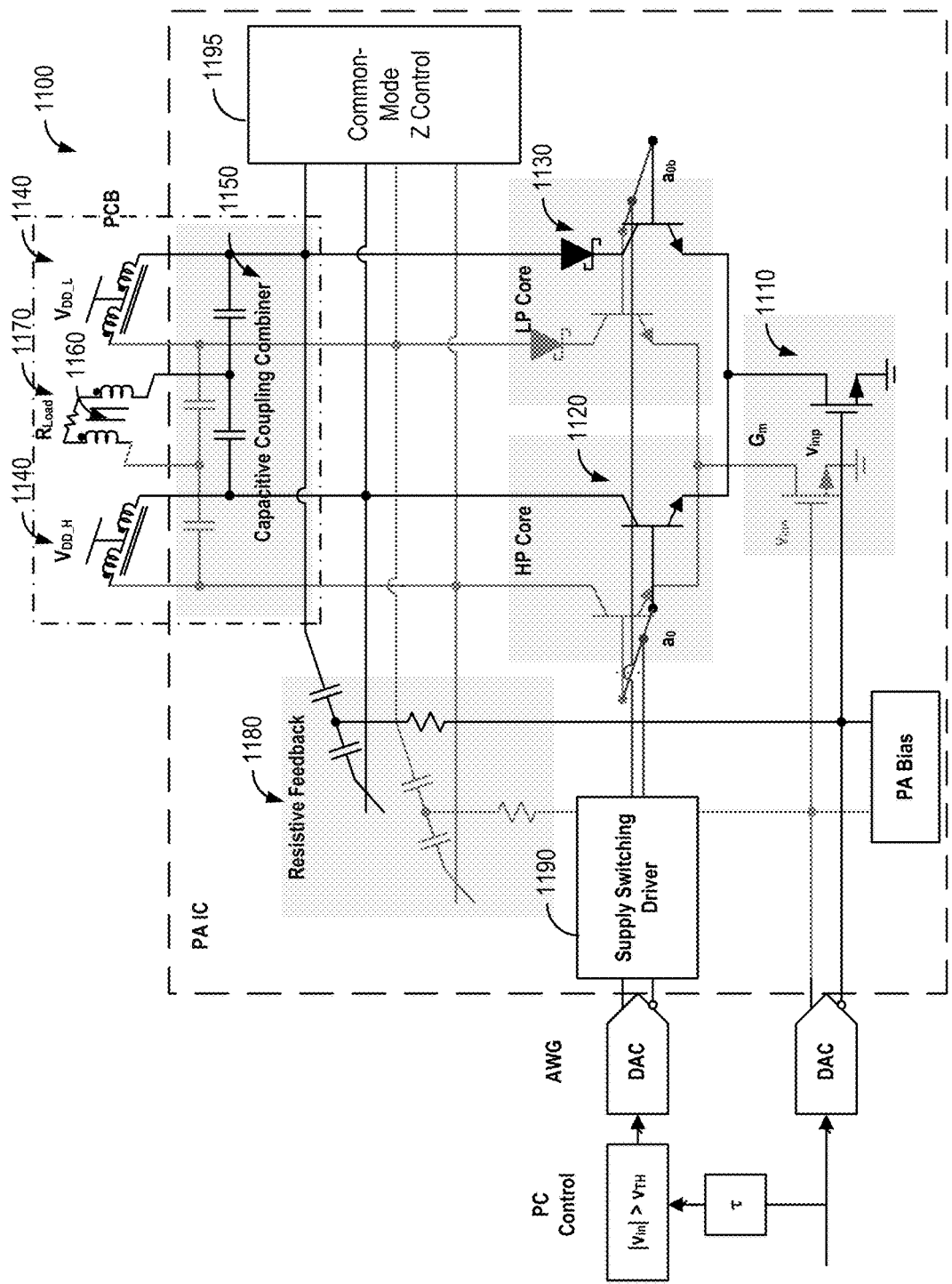
FIG. 11 illustrates an example power amplifier with instantaneous supply switching in accordance with one or more implementations.
Figure 12:
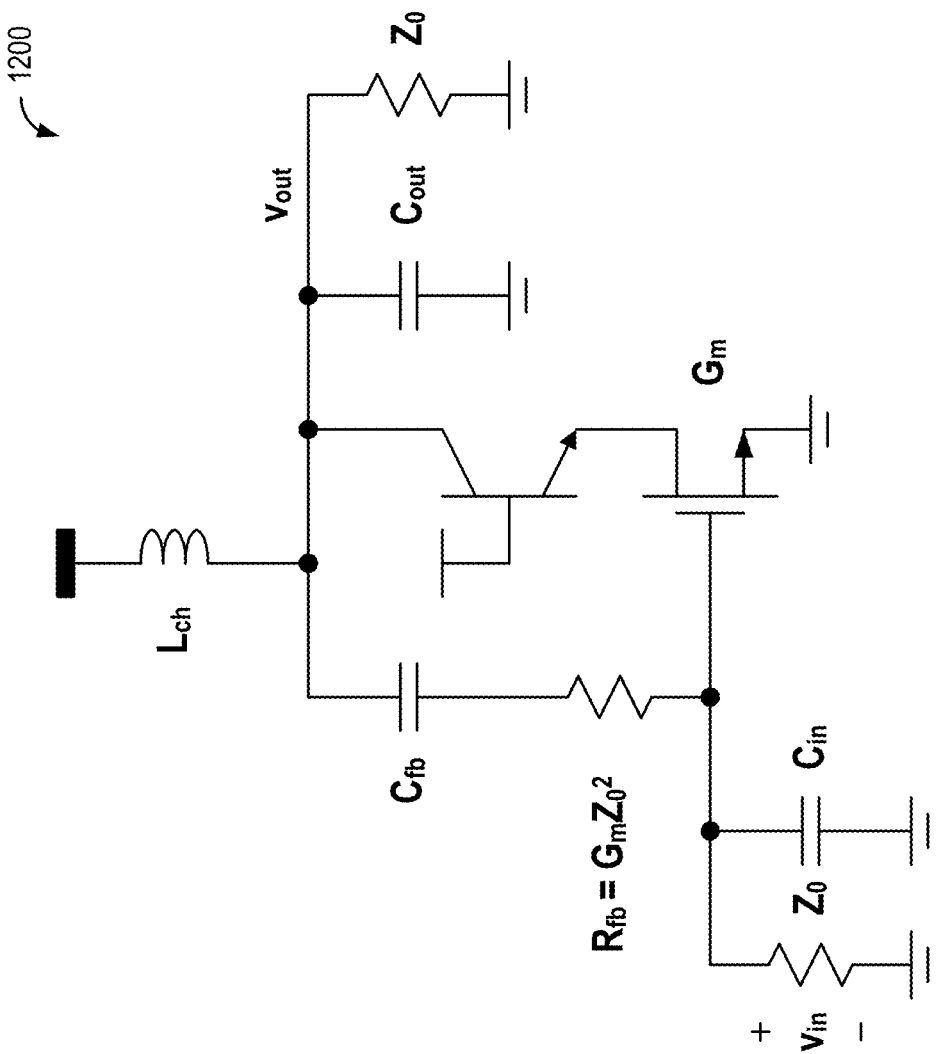
FIG. 12 illustrates an example small-signal equivalent circuit of a resistive shunt-feedback power amplifier core in accordance with one or more implementations.

FIG. 11 illustrates an example power amplifier with instantaneous supply switching 1100 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In one or more implementations, the power amplifier with instantaneous supply switching 1100 is designed and fabricated using a 0.18 µm SiGe QF process. This process features high-breakdown-voltage BJT transistors and standard 0.18 µm CMOS devices.

The power amplifier with instantaneous supply switching 1100 utilizes pseudo-differential common-source NMOS transistors (e.g., 1110) biased in Class-AB as the input stage, cascoded with BJT transistors (e.g., 1120) as the current-mode supply switches. In one or more implementations, the input stage can utilize low-voltage, high-speed transistors other than NMOS transistors depending on implementation without departing from the scope of the present disclosure. In one or more implementations, the current-mode supply switches can utilize high-voltage, low-speed transistors other than BJT transistors depending on implementation without departing from the scope of the present disclosure.

The push-push differential architecture doubles the output swing and suppresses even-order distortion. The high-power (HP) core is connected to $V_{DD\_H}$=7.5 V, whereas the low-power (LP) core is cascoded with Schottky diode clamps (e.g., 1130) for protection, and then connected to $V_{DD\_L}$=4.5 V. The clamp diodes are implemented when the supply is switched from $V_{DD\_H}$ to $V_{DD\_L}$ with strong signal magnitude. The PN junction from base to collector at the LP core would turn on without the diodes, leading to severe distortion and reliability issues. Moderate drawbacks of the clamp diodes are added capacitance and the extra headroom they require.

The PA is biased through center-tapped transformers (e.g., 1140), which prevent large voltage jumps. The capacitive coupling combiner (e.g., 1150) couples signal to the balun (e.g., 1160), and reduces jumps due to residual flux change in the parasitic inductances of the load circuit (e.g., 1170). Finally, a broadband 1:1 common-mode choke serves as the balun (e.g., 1160), coupling to a single-ended 75 Ωload (e.g., 1170). Resistive shunt-feedback (e.g., 1180) is used for simultaneous wideband input and output impedance matching. The supply-switching driver (e.g., 1190) and output common-mode impedance control network (e.g., 1195) are also included, and will be discussed later.

In one or more implementations, the power amplifier with instantaneous supply switching 1100 includes a gain circuit (e.g., 1110), a supply switch circuit (e.g., 1120), a first bias transformer (e.g., 1140) and a second bias transformer (e.g., 1140), and a capacitive coupling combiner (e.g., 1150). The supply switch circuit may be configured to detect a magnitude of an outgoing broadband communication signal, and determine whether the magnitude of the outgoing broadband communication signal exceeds a predetermined voltage threshold. The first bias transformer is coupled to a first voltage supply rail (e.g., $V_{DD\_H}$) and configured to bias the gain circuit with the first voltage supply rail. The second bias transformer is coupled to a second voltage supply rail (e.g., $V_{DD\_L}$) and configured to bias the gain circuit with the second voltage supply rail. The capacitive coupling combiner is coupled to the first bias transformer and the second bias transformer and configured to reduce a residual flux change between the firs bias transformer and the second bias transformer. In one or more implementations, the gain circuit applies a first gain to the outgoing broadband communication signal using a first voltage supply rail when it is determined that the magnitude exceeds the predetermined voltage threshold. In one or more implementations, gain circuit applies a second gain to the outgoing broadband communication signal using a second voltage supply rail when it is determined that the magnitude does not exceed the predetermined voltage threshold. In some aspects, the second voltage supply rail (e.g., $V_{DD\_L}$) is smaller than the first voltage supply rail (e.g., $V_{DD\_H}$).

In one or more implementations, the gain circuit produces an output signal from the outgoing broadband communication signal with the applied first gain or the applied second gain. In some implementations, a current of the outgoing broadband communication signal is switched between the first voltage supply rail and the second voltage supply rail in response to the magnitude being detected by the supply switch circuit.

The first bias transformer may include a center-tapped bias transformer, in which the first voltage supply rail is coupled to a node between two windings of the first bias transformer. The second bias transformer may include a center-tapped bias transformer, in which the second voltage supply rail is coupled to a node between two windings of the second bias transformer.

In one or more implementations, the supply switch circuit includes a first switching core circuit and a second switching core circuit, in which the first switching core circuit is associated with the first voltage supply rail and the second switching core circuit is associated with the second voltage supply rail. In some aspects, the first switching core circuit and the second switching core circuit receive different input signals to switch between the first voltage supply rail and the second voltage supply rail.

In one or more implementations, the first switching core circuit includes a first differential pair of transistors and the second switching core circuit includes a second differential pair of transistors. The first differential pair of transistors may be respectively coupled to opposing nodes of the first bias transformer and the second differential pair of transistors may be respectively coupled to opposing nodes of the second bias transformer.

In one or more implementations, the gain circuit includes a third differential pair of transistors. In some aspects, a first transistor of the third differential pair of transistors is coupled to a first common emitter node with a first transistor of the first differential pair of transistors and a first transistor of the second differential pair of transistors. In some aspects, a second transistor of the third differential pair of transistors is coupled to a second common emitter node with a second transistor of the first differential pair of transistors and a second transistor of the second differential pair of transistors. The first transistor and the second transistor of the third differential pair of transistors are configured to receive respective differential inputs of the outgoing broadband communication signal.

In one or more implementations, the first differential pair of transistors and the second differential pair of transistors include bipolar junction transistors. In one or more implementations, the third differential pair of transistors include NMOS transistors. In this respect, the emitter nodes of the first differential pair of transistors and the second differential pair of transistors may be coupled to the drain nodes of the third differential pair of transistors.

In one or more implementations, the power amplifier with instantaneous supply switching 1100 includes a bias circuit configured to control a gate voltage to the third differential pair of transistors, in which the third differential pair of transistors is biased to operate in a predetermined amplifier class. In some aspects, the predetermined amplifier class is Class AB. In other aspects, the predetermined amplifier class is Class A, Class B, Class G or another predetermined amplifier class depending on implementation.

In one or more implementations, the power amplifier with instantaneous supply switching 1100 includes a digital-to-analog converter coupled to the gain circuit and configured to supply the outgoing broadband communication signal. In some aspects, the bias circuit controls a direct voltage associated with the outgoing broadband communication signal from the digital-to-analog converter.

In one or more implementations, the power amplifier with instantaneous supply switching 1100 includes a supply switching driver circuit configured to supply a supply-switching control signal to the supply switch circuit. In some aspects, the supply switching driver circuit includes a level shifter, a pre-driver network and a driver network. The level shifter is cascaded with the pre-driver network and the driver network. In some aspects, the level shifter is configured to transfer the supply-switching control signal to a first path and a second path through the pre-driver network and the driver network. The first path may maintain an input voltage at a first voltage and the second path may shift the input voltage to a second voltage that is greater than the first voltage.

In one or more implementations, the power amplifier with instantaneous supply switching 1100 includes a resistive feedback circuit coupled to an input to the gain circuit and to outputs of the first bias transformer and the second bias transformer. In some aspects, the resistive feedback circuit includes a shunt feedback resistor that is configured to simultaneously match an impedance associated with the input to the gain circuit to an impedance associated with the outputs of the first bias transformer and the second bias transformer.

In one or more implementations, the power amplifier with instantaneous supply switching 1100 includes an impedance control circuit coupled in parallel to collector nodes of bipolar junction transistors of the supply switch circuit, in which the impedance control circuit is configured to reduce a common-mode impedance as a function of frequency.

In one or more implementations, the power amplifier with instantaneous supply switching 1100 includes a plurality of diode clamps coupled directly to collector nodes of bipolar junction transistors of the supply switch circuit that are associated with the second voltage supply rail. The plurality of diode clamps may be configured to prevent current flow from base nodes to the collector nodes of the bipolar junction transistors when the current of the outgoing broadband communication signal is switched from the first voltage supply rail to the second voltage supply rail.

In one or more implementations, the power amplifier with instantaneous supply switching 1100 includes a balun coupled to the capacitive coupling combiner. In one or more implementations, the power amplifier with instantaneous supply switching 1100 also includes a load circuit coupled to the balun. In some aspects, the balun is a common-mode choke. In other aspects, the capacitive coupling combiner couples the output signal to the balun and reduces voltage jumps associated with a residual flux change in parasitic inductances of the load circuit.

FIG. 12 illustrates an example small-signal equivalent circuit of a resistive shunt-feedback power amplifier core 1200 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The differential-mode half circuit of the PA core is shown in FIG. 12. The shunt feedback resistor $R_{fb}=G_m Z_0^2$ is for broadband input and output impedance matching. The voltage gain of this topology is $-A_v=-(G_m Z_0-1)$. The shunt-feedback topology provides output matching with better efficiency than a shunt resistor ($R_{ter}$) to AC ground. Power dissipation in $R_{fb}$ is $P_{out}/(A_v+1)$, which is very small compared to dissipation in $R_{ter}=P_{out}$. The bandwidth of the PA is from $\omega_{p1}$ to min $[\omega_{p2}, 1/(C_{in}Z_0)]$, where $$C_{fb} \cong L_{ch}/(A_V Z_0^2) \qquad \text{Equation (3)}$$

$$\omega_{p1} \cong Z_0/(2L_{ch}) \qquad \text{Equation (4)}$$

$$\omega_{p2} \cong 2\omega_{T_{BJT}}/(\alpha G_{m_{BJT}} Z_0), \ \alpha \cong 0.6 \qquad \text{Equation (5)}$$

$$1/(C_{in}Z_0) \cong \omega_{T_{CMOS}}/A_V \qquad \text{Equation (6)}$$

The $f_T$ of the BJT and NMOS transistors in this process are 28 GHz and 56 GHz, respectively Substituting these process parameters, the PA has estimated voltage gain of 20 dB and bandwidth from 6 MHz to 1.3 GHz. Note that the input common-source devices are NMOS for higher input bandwidth, and the cascode devices are BJT for high-voltage tolerance. In one or more implementations, $BV_{CBO}$=18 V is the critical breakdown metric (not $BV_{CEO}$=8 V) since the BJT base nodes have low impedance drive.

Figure 13:
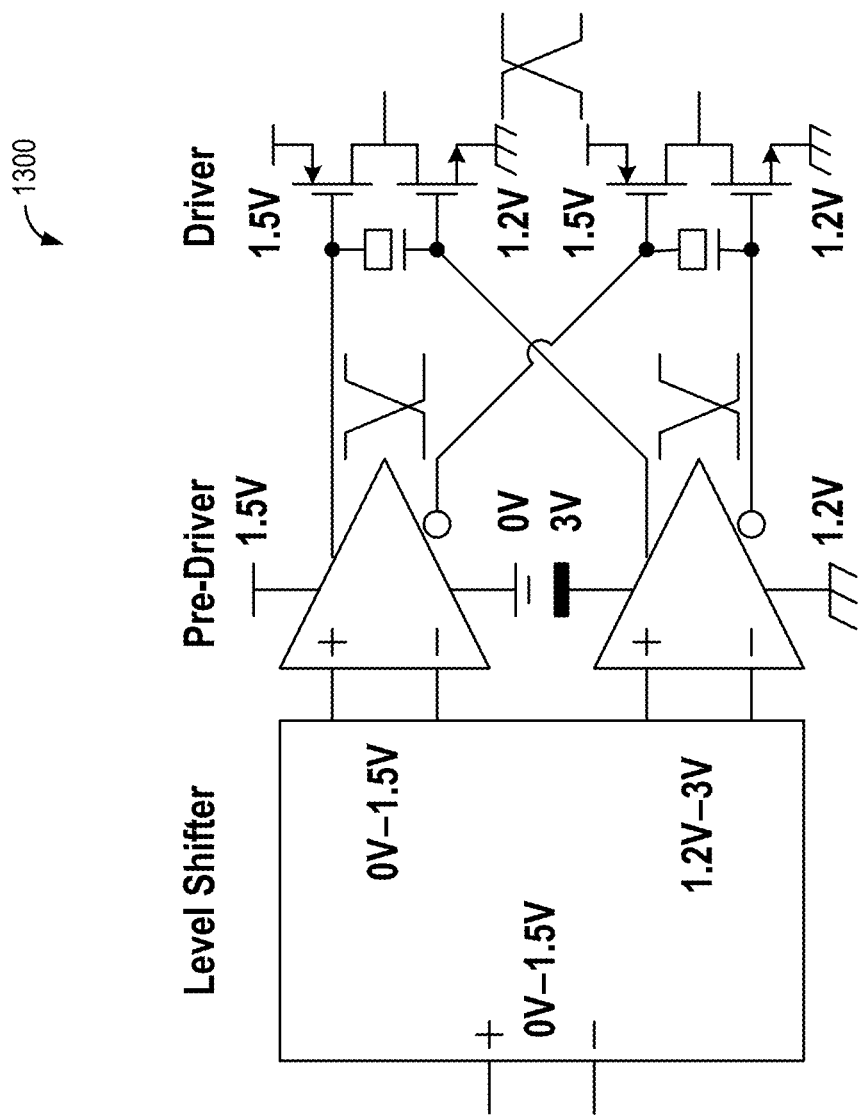
FIG. 13 illustrates an example supply switching driver in accordance with one or more implementations.
Figure 14:
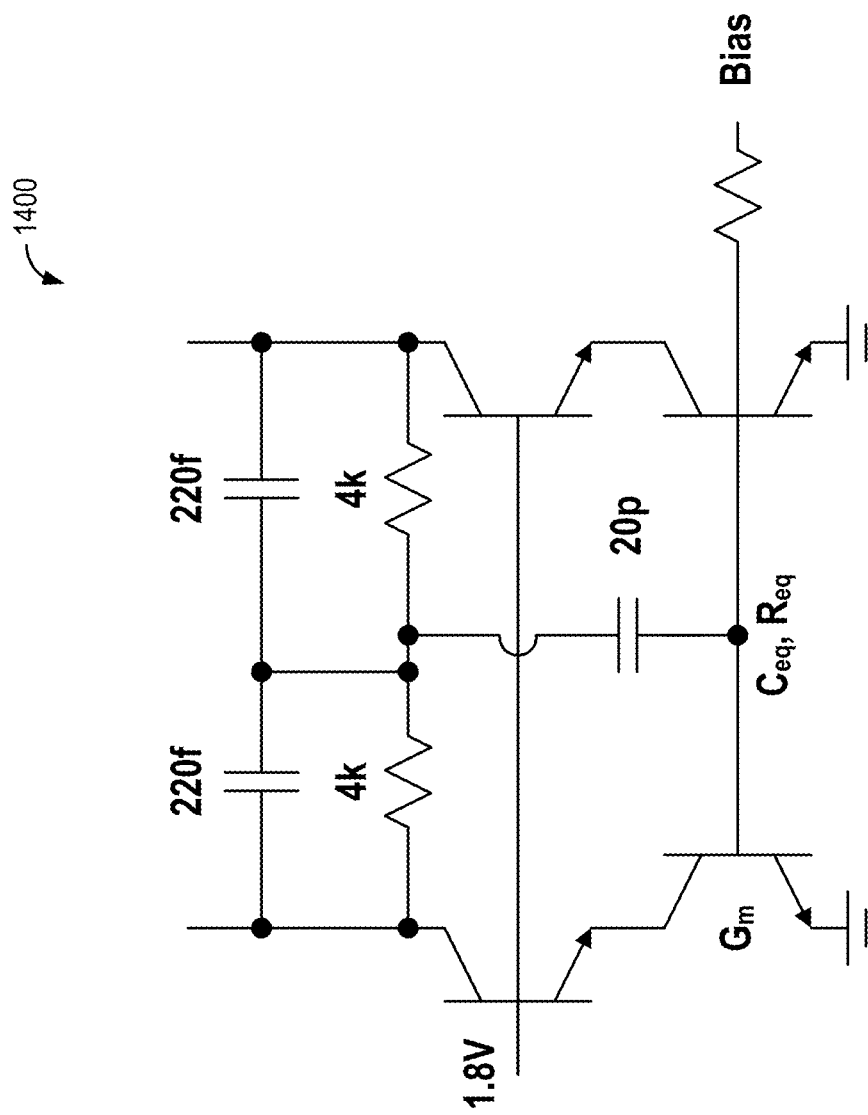
FIG. 14 illustrates an example output common-mode impedance control network in accordance with one or more implementations.

FIG. 13 illustrates an example supply switching driver 1300 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The supply-switching driver 1300 includes a level shifter cascaded with pre-driver and driver inverters. In one or more implementations, CMOS inverter drivers are utilized instead of current-mode logic (CML) drivers to save power at the expected supply-switching rates. Note that the target signals have high PAPR, so peaks are relatively infrequent. The Class-B CMOS drivers naturally have lower quiescent power consumption than CIVIL drivers. The level shifter transfers the supply-switching control signal to two paths. One path maintains the input 0-1.5 V levels; the second path level shifts upwards to 1.2-3 V The voltage crossings are intentionally asymmetric to establish make-before-break action in current-mode switching; this minimizes flux-change-induced voltage jumps. Varactors at the gates of the drivers time-align the signals in the two paths (0-1.5 V and 1.2-3 V). The swing is increased from $6v_T$=150 mV to 300 mV to ensure that the current is fully switched from one power rail to another. Simulated supply-switching bandwidth is approximately 2 GHz. The driver consumes less than 10 mW for typical signals, whereas the instantaneous supply switching saves total DC power greater than 250 mW.

The push-push Class-AB PA core (e.g., 1110) generates large output common-mode current. The center-tapped bias transformer (e.g., 1140) has low common-mode impedance at relatively low frequencies. Hence, the output common-mode voltage signal is small enough that it does not constrict low-frequency differential swing and $P_{SAT}$. However, the parasitic leakage inductances have common-mode impedance proportional to frequency. At high frequencies, the increasing output common-mode voltage signal reduces the achievable undistorted differential swing, which limits $P_{SAT}$.

FIG. 14 illustrates an example output common-mode impedance control network 1400 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

To improve the undistorted differential swing, the common-mode impedance control network 1400 in FIG. 14 is paralleled with the collectors of the PA core. The common-mode impedance control network 1400 has a high differential impedance of 4 k$\Omega$ and a low common-mode impedance of (1+4 k/$R_{eq}$)/$G_m$. Note that the value of feedback capacitors and resistors (220 fF and 4 k$\Omega$) are designed to have the same ratio of $C_{eq}$ to $R_{eq}$ of common emitter $G_m$ cell for flat frequency response. The simulation shows that the output common-mode impedance control network 1400 can achieve 10 GHz BW with common-mode impedance less than 50$\Omega$.

Figure 15:
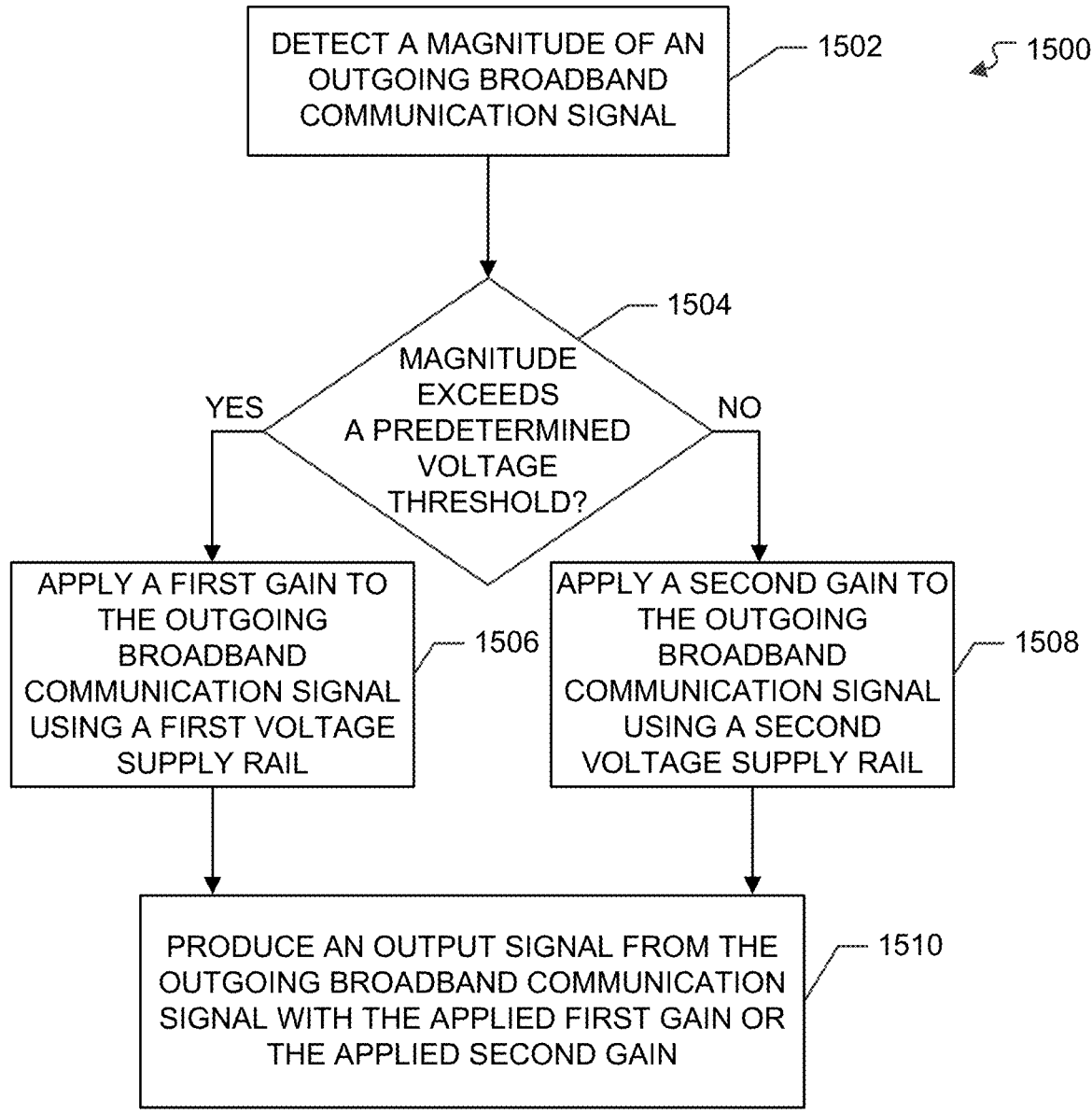
FIG. 15 illustrates a flow diagram of an example process of a media converter having a power amplifier with supply switching in a content distribution system in accordance with one or more implementations.

FIG. 15 illustrates a flow diagram of an example process of a media converter 135A-C having a power amplifier with supply switching in a content distribution system in accordance with one or more implementations. For explanatory purposes, the example process 1500 is described herein with reference to the media converters 135A-C of FIGS. 1 and 2; however, the example process 1500 is not limited to the media converters 135A-C of FIGS. 1 and 2, and the example process 1500 may be performed by one or more of the components of the media converters 135A-C of FIGS. 1 and 2. Further for explanatory purposes, the blocks of the example process 1500 are described herein as occurring in serial, or linearly. However, multiple blocks of the example process 1500 may occur in parallel. In addition, the blocks of the example process 1500 need not be performed in the order shown and/or one or more of the blocks of the example process 1500 need not be performed.

The media converters 135A-C detect a magnitude of an outgoing broadband communication signal (1502). For example, a power amplifier circuit of one of the media converters 135A-C, such as media converter 135A, may receive a broadband communication signal such as a multi-carrier signal (e.g., OFDM, OFDMA) through a differential signal path from one or more digital-to-analog converter modules of the media converter 135A. The media converter 135A determines whether the magnitude of the outgoing broadband communication signal exceeds a predetermined voltage threshold (1504). For example, a supply switching driver circuit of the power amplifier may monitor and detect fluctuations in the outgoing broadband communication signal with respect to the threshold voltage.

The media converters 135A-C apply a first gain to the outgoing broadband communication signal using a first voltage supply rail when it is determined that the magnitude exceeds the predetermined voltage threshold (1506). For example, the power amplifier circuit of the media converter 135A increases the gain of the outgoing broadband communication signal using a high-voltage supply rail (e.g., 7.5 V). The media converters 135A-C apply a second gain to the outgoing broadband communication signal using a second voltage supply rail when it is determined that the magnitude does not exceed the predetermined voltage threshold (1508). For example, the power amplifier circuit of the media converter 135A increases the gain of the outgoing broadband communication signal using a low-voltage supply rail (e.g., 4.5 V), where the second gain associated with the low-voltage supply rail is smaller than the first gain associated with the high-voltage supply rail.

The media converters 135A-C provide an output signal from the outgoing broadband communication signal with the applied first gain or the applied second gain (1510). For example, the output signal may represent a modulated (QAM) multi-carrier signal (e.g., OFDM) with the applied gain from either the high-voltage supply rail or the low-voltage supply rail, where the output signal is associated with a relatively high PAPR and relatively high fractional bandwidth.

Figure 16:
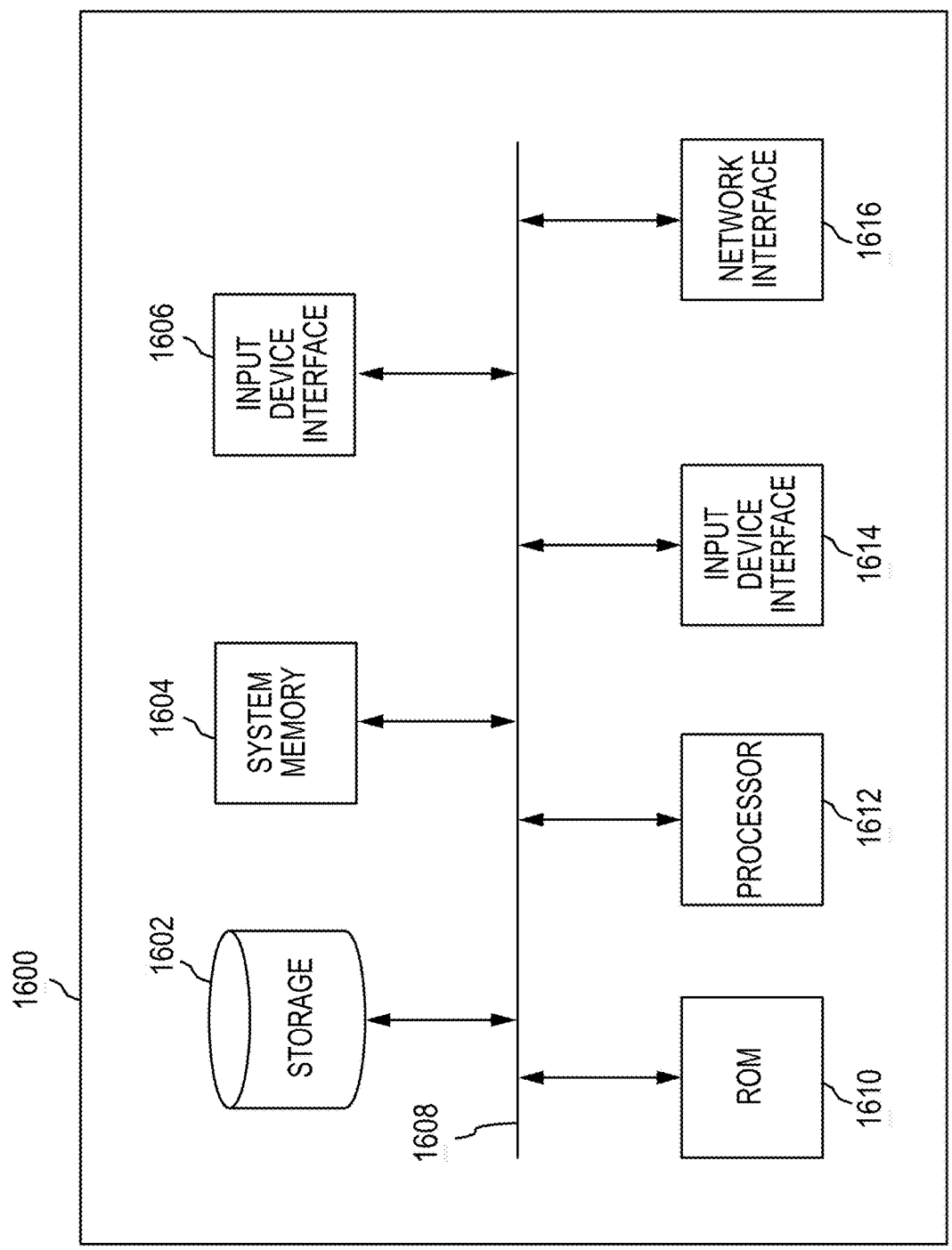
FIG. 16 conceptually illustrates an electronic system with which any implementations of the subject technology are implemented.

FIG. 16 conceptually illustrates an electronic system 1600 with which one or more implementations of the subject technology may be implemented. The electronic system 1600, for example, can be a desktop computer, a laptop computer, a tablet computer, a server, a switch, a router, a base station, a receiver, a phone, a personal digital assistant (PDA), or generally any electronic device that transmits signals over a network. The electronic system 1600 may be, and/or may include one or more components of, one or more of the media converters 135A-C, one or more of the gateway devices 225A-I, one or more of the electronic devices 222A-I, 226A-I, 228A-I. Such an electronic system 1600 includes various types of computer readable media and interfaces for various other types of computer readable media. The electronic system 1600 includes a bus 1608, one or more processing unit(s) 1612, a system memory 1604, a read-only memory (ROM) 1610, a permanent storage device 1602, an input device interface 1614, an output device interface 1606, one or more network interfaces 1616, such as local area network (LAN) interfaces and/or wide area network interfaces (WAN), or subsets and variations thereof.

The bus 1608 collectively represents all system, peripheral, and chipset buses that communicatively connect the numerous internal devices of the electronic system 1600. In one or more implementations, the bus 1608 communicatively connects the one or more processing unit(s) 1612 with the ROM 1610, the system memory 1604, and the permanent storage device 1602. From these various memory units, the one or more processing unit(s) 1612 retrieves instructions to execute and data to process in order to execute the processes of the subject disclosure. The one or more processing unit(s) 1612 can be a single processor or a multi-core processor in different implementations.

The ROM 1610 stores static data and instructions that are needed by the one or more processing unit(s) 1612 and other modules of the electronic system 1600. The permanent storage device 1602, on the other hand, may be a read-and-write memory device. The permanent storage device 1602 may be a non-volatile memory unit that stores instructions and data even when the electronic system 1600 is off. In one or more implementations, a mass-storage device (such as a magnetic or optical disk and its corresponding disk drive) may be used as the permanent storage device 1602.

In one or more implementations, a removable storage device (such as a floppy disk, flash drive, and its corresponding disk drive) may be used as the permanent storage device 1602. Like the permanent storage device 1602, the system memory 1604 may be a read-and-write memory device. However, unlike the permanent storage device 1602, the system memory 1604 may be a volatile read-and-write memory, such as random access memory. The system memory 1604 may store any of the instructions and data that one or more processing unit(s) 1612 may need at runtime. In one or more implementations, the processes of the subject disclosure are stored in the system memory 1604, the permanent storage device 1602, and/or the ROM 1610. From these various memory units, the one or more processing unit(s) 1612 retrieves instructions to execute and data to process in order to execute the processes of one or more implementations.

The bus 1608 also connects to the input and output device interfaces 1614 and 1606. The input device interface 1614 enables a user to communicate information and select commands to the electronic system 1600. Input devices that may be used with the input device interface 1614 may include, for example, alphanumeric keyboards and pointing devices (also called "cursor control devices"). The output device interface 1606 may enable, for example, the display of images generated by electronic system 1600. Output devices that may be used with the output device interface 1606 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 16, the bus 1608 also couples the electronic system 1600 to a network (not shown) through one or more network interfaces 1616, such as one or more LAN interfaces and/or WAN interfaces. In this manner, the electronic system 1600 can be a part of a network of computers, such as a LAN, a WAN, an Intranet, or a network of networks, such as the Internet. Any or all components of the electronic system 1600 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A power amplifier, comprising:
   a gain circuit;
   a supply switch circuit configured to determine whether a magnitude of an outgoing broadband communication signal exceeds a predetermined voltage threshold;
   a first bias transformer coupled to a first voltage supply rail and configured to bias the gain circuit with the first voltage supply rail; and a second bias transformer coupled to a second voltage supply rail smaller than the first voltage supply rail and configured to bias the gain circuit with the second voltage supply rail, wherein the gain circuit is configured to:
  apply a first gain to the outgoing broadband communication signal using the first voltage supply rail when the magnitude exceeds the predetermined voltage threshold;
  apply a second gain to the outgoing broadband communication signal using the second voltage supply rail when the magnitude does not exceed the predetermined voltage threshold; and
  produce an output signal from the outgoing broadband communication signal with the applied first gain or the applied second gain.

2. The power amplifier of claim 1, wherein the supply switch circuit is configured to:
  detect the magnitude of the outgoing broadband communication signal; and
  switch a current of the outgoing broadband communication signal between the first voltage supply rail and the second voltage supply rail in response to the magnitude being detected by the supply switch circuit.

3. The power amplifier of claim 1, further comprising:
a capacitive coupling combiner coupled to the first bias transformer and the second bias transformer and configured to reduce a residual flux change between the first bias transformer and the second bias transformer.

4. The power amplifier of claim 3, further comprising:
a balun coupled to the capacitive coupling combiner; and
a load circuit coupled to the balun,
wherein the balun is a common-mode choke, and
wherein the capacitive coupling combiner couples the output signal to the balun and reduces voltage jumps associated with a residual flux change in parasitic inductances of the load circuit.

5. The power amplifier of claim 1, further comprising:
a supply switching driver circuit configured to supply a supply-switching control signal to the supply switch circuit, wherein the supply switching driver circuit comprises a level shifter, a pre-driver network and a driver network, wherein the level shifter is cascaded with the pre-driver network and the driver network, wherein the level shifter is configured to transfer the supply-switching control signal to a first path and a second path through the pre-driver network and the driver network, the first path maintaining an input voltage at a first voltage and the second path shifting the input voltage to a second voltage greater than the first voltage.

6. The power amplifier of claim 1, further comprising:
a resistive feedback circuit coupled to an input to the gain circuit and to outputs of the first bias transformer and the second bias transformer, wherein the resistive feedback circuit comprises a shunt feedback resistor configured to simultaneously match an impedance associated with the input to the gain circuit to an impedance associated with the outputs of the first bias transformer and the second bias transformer.

7. The power amplifier of claim 1, further comprising:
an impedance control circuit coupled in parallel to collector nodes of bipolar junction transistors of the supply switch circuit, wherein the impedance control circuit is configured to reduce a common-mode impedance as a function of frequency.

8. The power amplifier of claim 1, further comprising:
a plurality of diode clamps coupled directly to collector nodes of bipolar junction transistors of the supply switch circuit that are associated with the second voltage supply rail, the plurality of diode clamps configured to prevent current flow from base nodes to the collector nodes of the bipolar junction transistors when current of the outgoing broadband communication signal is switched from the first voltage supply rail to the second voltage supply rail.

9. The power amplifier of claim 1, wherein each of the first bias transformer and the second bias transformer includes a center-tapped bias transformer, wherein the first voltage supply rail is coupled to a node between two windings of the first bias transformer, and wherein the second voltage supply rail is coupled to a node between two windings of the second bias transformer.

10. A method of supply switching, comprising:
determining whether a magnitude of an outgoing broadband communication signal exceeds a predetermined voltage threshold;
increasing a voltage of an outgoing broadband communication signal to a first gain associated with the first voltage supply rail using the first bias transformer when the magnitude of the outgoing broadband communication signal exceeds the predetermined voltage threshold, and
increasing the voltage of the outgoing broadband communication signal by a second gain associated with the second voltage supply rail using the second bias transformer when the magnitude of the outgoing broadband communication signal does not exceed the predetermined voltage threshold, wherein the second gain associated with the second voltage supply rail is smaller than the first gain associated with the first voltage supply rail; and
producing an output signal from the outgoing broadband communication signal with the first gain or the second gain.

11. The method of claim 10, further comprising:
detecting the magnitude of an outgoing broadband communication signal; and
switching a current of the outgoing broadband communication signal between the first voltage supply rail and the second voltage supply rail in response to the detecting of the magnitude.

12. The method of claim 10, further comprising:
supplying a differential bias signal to an input of a power amplifier to control a gate voltage to a differential transistor pair of the power amplifier based on a predetermined class bias of the power amplifier.

13. The method of claim 10, further comprising:
selecting the first voltage supply rail when the magnitude is greater than the predetermined voltage threshold; and
biasing a power amplifier through a first plurality of center-tapped transformers associated with the first voltage supply rail.

14. The method of claim 10, further comprising:
selecting the second voltage supply rail when the magnitude is smaller than the predetermined voltage threshold; and
biasing a power amplifier through a second plurality of center-tapped transformers associated with the second voltage supply rail.

15. The method of claim 10, further comprising:
supplying a differential supply switch control signal to respective ones of a plurality of cascode transistors to facilitate a rail transition between the first voltage supply rail and the second voltage supply rail.

16. A system for supply switching, the system comprising:
a gain circuit;
a first bias transformer coupled to a first voltage supply rail and configured to bias the gain circuit with the first voltage supply rail; and
a second bias transformer coupled to a second voltage supply rail smaller than the first voltage supply rail and configured to bias the gain circuit with the second voltage supply rail,
wherein the gain circuit is configured to:
increase a voltage of an outgoing broadband communication signal to a first gain associated with the first voltage supply rail using the first bias transformer when a magnitude of the outgoing broadband communication signal exceeds a predetermined voltage threshold, and
increase the voltage of the outgoing broadband communication signal by a second gain associated with the second voltage supply rail using the second bias transformer when the magnitude of the outgoing broadband communication signal does not exceed the predetermined voltage threshold,
wherein the second gain associated with the second voltage supply rail is smaller than the first gain associated with the first voltage supply rail.

17. The system of claim 16, further comprising:
a supply switch circuit configured to determine whether the magnitude of the outgoing broadband communication signal exceeds the predetermined voltage threshold.

18. The system of claim 17, wherein the supply switch circuit includes a BJT current-mode switch integrated in a differential power amplifier.

19. The system of claim 18, wherein the supply switch circuit is configured to:
detect the magnitude of the outgoing broadband communication signal; and
switch a current of the outgoing broadband communication signal between the first voltage supply rail and the second voltage supply rail in response to the magnitude being detected.

20. The system of claim 16, wherein each of the first bias transformer and the second bias transformer includes a center-tapped bias transformer, wherein the first voltage supply rail is coupled to a node between two windings of the first bias transformer, and wherein the second voltage supply rail is coupled to a node between two windings of the second bias transformer.

* * * * *